(12) United States Patent
Li et al.

(10) Patent No.: US 11,802,898 B2
(45) Date of Patent: Oct. 31, 2023

(54) METHOD, APPARATUS, AND DEVICE OF RECONSTRUCTING NON-KRONECKER STRUCTURED CHANNELS

(71) Applicant: Beijing University of Posts and Telecommunications, Beijing (CN)

(72) Inventors: Yong Li, Beijing (CN); Wenbo Wang, Beijing (CN); Mugen Peng, Beijing (CN)

(73) Assignee: Beijing University of Posts and Telecommunications, Beijing (CN)

( * ) Notice: Subject to any disclaimer, the term of this patent is extended or adjusted under 35 U.S.C. 154(b) by 285 days.

(21) Appl. No.: 17/215,483

(22) Filed: Mar. 29, 2021

(65) Prior Publication Data

US 2022/0163579 A1 May 26, 2022

(51) Int. Cl.
*H04B 17/391* (2015.01)
*G01R 29/10* (2006.01)
(Continued)

(52) U.S. Cl.
CPC ......... *G01R 29/0878* (2013.01); *G01R 29/10* (2013.01); *H04B 17/3912* (2015.01); *H04L 25/0212* (2013.01)

(58) Field of Classification Search
CPC .... H04B 17/00; H04B 17/309; H04B 17/336; H04B 17/3912; H04L 25/0212; G01R 29/0878; G01R 29/10
(Continued)

(56) References Cited

U.S. PATENT DOCUMENTS 10,735,110 B2 * 8/2020 Devarasetty .......... H04L 5/0048
11,088,744 B1 * 8/2021 Hammond .......... H04W 56/001
(Continued)

FOREIGN PATENT DOCUMENTS

| CN | 107040296 A | 8/2017 |
|---|---|---|
| CN | 108390706 A | 8/2018 |
| CN | 110708125 A | 1/2020 |

OTHER PUBLICATIONS

Office Action in corresponding Chinese patent application No. 202011345595.6, dated Jul. 12, 2021.
(Continued)

*Primary Examiner* — Young T. Tse
(74) *Attorney, Agent, or Firm* — MARSHALL, GERSTEIN & BORUN LLP

(57) ABSTRACT

Embodiments provide a method, apparatus and device of reconstructing non-Kronecker structured channels, applicable to communications. A weight matrix is determined for emulating link characteristics of a reconstructed channel, and includes a weight corresponding to each ray mapped to a probe antenna. In each cluster, rays mapped to each probe antenna have different weights with each other. For each cluster, a time-varying fading channel impulse response of each ray of the cluster mapped to a probe antenna is calculated using the weight matrix. The time-varying fading channel impulse response includes a transition equation for each probe antenna describing mapping of rays of the cluster to the probe antenna. A transition matrix from each probe antenna to receiving antennas of a device under test is determined. A product of the time-varying fading channel impulse response of the cluster multiplied by the transition matrix serves as a channel impulse response of the cluster.

20 Claims, 4 Drawing Sheets

(51) Int. Cl.
*H04L 25/02* (2006.01)
*G01R 29/08* (2006.01)

(58) Field of Classification Search
USPC .............. 375/224, 260, 267; 324/750.15
See application file for complete search history.

(56) References Cited

U.S. PATENT DOCUMENTS

| | | | |
|---|---|---|---|
| 2012/0098713 A1* | 4/2012 | Mow | H04B 17/0087 343/703 |
| 2015/0017928 A1* | 1/2015 | Griesing | H04B 17/0087 455/67.14 |
| 2016/0254830 A1 | 9/2016 | Corbalis et al. | |
| 2017/0373773 A1* | 12/2017 | Jing | H04B 17/102 |
| 2018/0212695 A1* | 7/2018 | Kyrolainen | H04B 17/3911 |
| 2020/0304182 A1 | 9/2020 | Ibrahim et al. | |

OTHER PUBLICATIONS

Wang Liqing et al., "Channel feed-back reconstruction based on compressed sensing", *Telecommunication Engineering*, vol. 59, No. 8, pp. 880-884 (2019). (English abstract).

Yong Li et al., "Dual Anechoic Chamber Setup for Over-the-Air Radiated Testing of 5G Devices", IEEE Transactions of Antennas and Propagation, vol. 68, No. 3, pp. 2469-2474 (2020).

* cited by examiner

```
┌─────────────────────────────────────────────────────────────────┐
│ determining a weight matrix, the weight matrix is for simulating link │
│ characteristics of a reconstructed channel, the weight matrix includes a weight │
│ corresponding to each ray mapped to a probe antenna; in each cluster, rays │ S301
│ mapped to each probe antenna have different weights with each other │
└─────────────────────────────────────────────────────────────────┘
                                  ↓
┌─────────────────────────────────────────────────────────────────┐
│ calculating, for each cluster, a time-varying fading channel impulse response of │
│ each ray of a cluster mapped to a probe antenna based on the weight matrix; │
│ the time-varying fading channel impulse response includes a transition │ S302
│ equation for each probe antenna describing mapping of rays of the cluster to │
│ the probe antenna │
└─────────────────────────────────────────────────────────────────┘
                                  ↓
┌─────────────────────────────────────────────────────────────────┐
│ determining a transition matrix from each probe antenna to receiving antennas │ S303
│ of a device under test │
└─────────────────────────────────────────────────────────────────┘
                                  ↓
┌─────────────────────────────────────────────────────────────────┐
│ using a product of the time-varying fading channel impulse response of the │ S304
│ cluster multiplied by the transition matrix as a channel impulse response of the │
│ cluster │
└─────────────────────────────────────────────────────────────────┘
```

FIG. 3A

```
┌─────────────────────────────────────────────────────────────────┐
│ determining a weight matrix, the weight matrix is for emulating link │
│ characteristics of a reconstructed channel, the weight matrix includes a weight │
│ corresponding to each ray mapped to a probe antenna; in each cluster, rays │ S301
│ mapped to each probe antenna have different weights with each other │
└─────────────────────────────────────────────────────────────────┘
                                  ↓
┌─────────────────────────────────────────────────────────────────┐
│ calculating, for each cluster, a time-varying fading channel impulse response of │
│ each ray of a cluster mapped to a probe antenna based on the weight matrix; │
│ the time-varying fading channel impulse response includes a transition │ S302
│ equation for each probe antenna describing mapping of rays of the cluster to │
│ the probe antenna │
└─────────────────────────────────────────────────────────────────┘
                                  ↓
┌─────────────────────────────────────────────────────────────────┐
│ determining a transition matrix from each probe antenna to receiving antennas │ S303
│ of a device under test │
└─────────────────────────────────────────────────────────────────┘
                                  ↓
┌─────────────────────────────────────────────────────────────────┐
│ using a product of the time-varying fading channel impulse response of the │ S304
│ cluster multiplied by the transition matrix as a channel impulse response of the │
│ cluster │
└─────────────────────────────────────────────────────────────────┘
                                  ↓
┌─────────────────────────────────────────────────────────────────┐
│ generating an output for each of the transmitting antennas of the testing │ S305
│ system by processing signals from the communication counterpart using the │
│ channel impulse response │
└─────────────────────────────────────────────────────────────────┘
```

FIG. 3B

METHOD, APPARATUS, AND DEVICE OF RECONSTRUCTING NON-KRONECKER STRUCTURED CHANNELS

CROSS-REFERENCE TO RELATED APPLICATION

This application claims the benefit and priority of Chinese Patent Application No. 202011345595.6, entitled "METHOD, APPARATUS, AND DEVICE OF RECONSTRUCTING NON-KRONECKER STRUCTURED CHANNELS" and filed on Nov. 26, 2020. The entire disclosure of the above application is incorporated herein by reference.

FIELD OF THE TECHNOLOGY

The present disclosure relates to telecommunication, and particularly, to a method, apparatus and device of reconstructing non-Kronecker structured channels.

BACKGROUND

In order to ensure the performance of communication devices, it is necessary to conduct a comprehensive test on product performances in the research and development stage and production stage of multi-antenna equipment. At present, over-the-air (OTA) testing test methods, e.g., the reverberation chamber (RC), the radiated two-stage (RTS), the multi-probe anechoic chamber (MPAC) or the like, of multi-antenna terminals are generally adopted in research to test the device under test (DUT). The MPAC method can simultaneously evaluate the performances of all key components of the DUT (such as antennas, RF front-ends, baseband processors) when testing product performance of the DUT, and can emulate the real wireless channel environment accurately, controllably and repeatably in a darkroom, therefore has received extensive attention.

The multi-path channel environment is usually illustrated by multiple clusters. Each cluster has a different delay and specific power angle spectrum (PAS), and may be reconstructed separately in a multi-probe anechoic chamber. OTA testing methods for Multiple-Input Multiple-Output (MIMO) devices, such as prefaded signal synthesis (PFS) and plane wave synthesis (PWS), may be used to reconstruct a target channel in a darkroom. Compared with the PWS method which aims at reproducing each ray within a cluster, the purpose of the PFS method is to reconstruct the spatial profile of each cluster. In addition, the PFS method does not require phase calibration. Therefore, the PFS method is widely used in OTA testing due to its simplicity and reliability.

Since the angle of arrival (AoA) is coupled with the angle of departure (AoD) for each ray, the power spectrum of the AoA for a cluster is dependent on the angle of departure (AoD)-Doppler spectrum. In OTA radiation testing using an OTA testing method, the antennas at the receiving end are usually not far apart and have the same antenna radiation pattern. The PFS method requires the probes are independent from each other and conform to identically distributed fading sequences, and the time correlation of the transmitting (Tx) antenna is independent of the time correlation of the receiving (Rx) antenna. Therefore, the target channel reconstructed based on the PFS method is a typical Kronecker channel model. The Kronecker channel model can represent many typical MIMO channels and may be used as a general correlation model.

However, the geometry-based stochastic channel (GBSC) model is not a Kronecker channel model, and can also be regarded as a Non-Kronecker channel model. That is, the conventional channel reconstructed based on the PFS method is a typical Kronecker channel model, but the actual target channel environment is a Non-Kronecker channel. Reconstructing a target channel of the Non-Kronecker channel model using the typical Kronecker channel model may result in inaccurate channel reconstruction.

SUMMARY

Embodiments of the present disclosure provide a method, apparatus and device of reconstructing non-Kronecker structured channels, to improve the accuracy of channel reconstruction. The technical schemes are as follows.

In a first aspect, embodiments of the present disclosure provide a method of reconstructing channels, including:

determining a weight matrix, the weight matrix is for emulating link characteristics of a reconstructed channel, the weight matrix includes a weight corresponding to each ray mapped to a probe antenna; in each cluster, rays mapped to each probe antenna have different weights with each other;

calculating, for each cluster, a time-varying fading channel impulse response of each ray of a cluster mapped to a probe antenna based on the weight matrix; the time-varying fading channel impulse response includes a transition equation for each probe antenna describing mapping of rays of the cluster to the probe antenna;

determining a transition matrix from each probe antenna to receiving antennas of a device under test (DUT); and using a product of the time-varying fading channel impulse response of the cluster multiplied by the transition matrix as a channel impulse response of the cluster.

In an embodiment, the procedure of determining the weight matrix may include:

acquiring a joint space-time correlation of a target channel;

determining a joint space-time correlation of the reconstructed channel;

constructing a target optimization equation using the joint space-time correlation of the target channel and the joint space-time correlation of the reconstructed channel; and obtaining the weight matrix by solving the target optimization equation using a convex optimization method.

In an embodiment, the procedure of determining the joint space-time correlation of the reconstructed channel may include:

calculating the joint space-time correlation $\hat{R}_t^{Pro}(u_1, s_1, t_1; u_i, s_j, t_m)$ of the reconstructed channel using a channel impulse response of each cluster at different time points using $\hat{R}_t^{Pro}(u_1, s_1, t_1; u_i, s_j, t_m) = \{\hat{R}_t^{Pro}(u_1, s_1, t_1; u_i, s_j, t_m)\} \in \mathbb{C}^{U \times S \times M}$;

where, $$\hat{R}_t^{Pro}(u_1, s_1, t_1; u_i, s_j, t_m) = \frac{1}{Q} \sum_{k=1}^{K} F_{u_1,u_i,k}^{Pro} \sum_{q=1}^{Q} \alpha_{k,q} \cdot F_{s_1,s_j,q}^{Pro} \cdot \Phi_{t_1,t_j,q}^{Pro}$$

$$F_{u_1,u_i,k}^{Pro} \triangleq F_{u_1}^V(\Omega_k) \cdot F_{u_i}^V(\Omega_k)^* \cdot \exp\left(j\frac{2\pi}{\lambda} r_k^{rx} \cdot d_{u_1}^{rx}\right) \cdot \exp\left(j\frac{2\pi}{\lambda} r_k^{rx} \cdot d_{u_i}^{rx}\right)^*$$

$$F_{s_1,s_j,k}^{Pro} \triangleq F_{s_1}^V(\Omega_{n,q}^{AoD}) \cdot F_{s_j}^V(\Omega_{n,q}^{AoD})^* \cdot \exp\left(j\frac{2\pi}{\lambda} r_{n,q}^{rx} \cdot d_{s_1}^{rx}\right) \cdot \exp\left(j\frac{2\pi}{\lambda} r_{n,q}^{rx} \cdot d_{s_j}^{rx}\right)^*$$

$$\Phi_{t_1,t_m,q}^{Pro} \triangleq \exp(j2\pi\vartheta_{n,q}t_1) \cdot \exp(j2\pi\vartheta_{n,q}t_m)^*,$$

where, $F_{u_1,u_i,k}^{Pro}$, denotes a correlation between receiving antennas relative to a k-th probe antenna, $F_{u_1}^V$ denotes a vertically polarized antenna pattern of a $u_1$-th receiving antenna of the DUT, $F_{u_i}^V$ denotes a vertically polarized antenna pattern of a $u_i$-th receiving antenna of the DUT, $\Omega_k$ denotes a spatial angle of the k-th probe antenna, $r_k^{rx}$ denotes a spherical unit vector of the k-th probe antenna, $d_{u_1}^{rx}$ denotes the position vector of the $u_1$-th receiving antenna relative to center of the base station, $F_{s_1,s_j,q}^{Pro}$ denotes a correlation between transmitting antennas relative to the q-th ray, $F_{s_1}^V$ denotes a vertically polarized antenna pattern of a $s_1$-th transmitting antenna of a user terminal, $\Omega_{n,q}^{AoD}$ denotes an angle of departure (AoD) of a q-th ray of a n-th cluster, $F_{s_j}^V$ denotes a vertically polarized antenna pattern of a $s_j$-th transmitting antenna of the user terminal, $r_{n,q}^{tx}$ a denotes ae spherical unit vector of transmitting antennas to $\Omega_{n,q}^{AoD}$, $d_{s_j}^{rx}$ denotes a position vector of the $s_j$-th transmitting antenna relative to center of the user terminal, $\Phi_{t_1,t_m,q}^{Pro}$ denotes a correlation function of the q-th ray of the n-th cluster at time point $t_1$ and time point $t_m$, $\vartheta_{n,q}$ denotes a Doppler frequency of the q-th ray of the n-th cluster, $\mathbb{C}$ denotes a complex number, $\mathbb{C}^{U\times S\times M}$ indicates elements of matrix $\hat{R}_t^{Pro}(u_1, s_1, t_1; u_i, s_j, t_m)$ are complex numbers, and dimension of the matrix is $U\times S\times M$.

In an embodiment, the procedure of constructing the target optimization equation using the joint space-time correlation of the target channel and the joint space-time correlation of the reconstructed channel may include:
construct a target optimization equation according to the joint space-time correlation of the target channel and the joint space-time correlation of the reconstructed channel as $$\min_G \left\| R_t(u_1, s_1, t_1; u_i, s_j, t_m) - \hat{R}_t^{Pro}(u_1, s_1, t_1; u_i, s_j, t_m; G) \right\|_2^2;$$

where, $R_t(u_1, s_1, t_1; u_i, s_j, t_m)$ denotes the joint space-time correlation of the target channel, $\hat{R}_t^{Pro}(u_1, s_1, t_1; u_i, s_j, t_m; G)$ denotes the joint space-time correlation of the reconstructed channel, and G is the weight matrix.

In an embodiment, the procedure of calculating, for each cluster, the time-varying fading channel impulse response of each ray of the cluster mapped to the probe antenna based on the weight matrix may include:
calculating, for each probe antenna, a transition equation of rays in the cluster mapped to the probe antenna using $h_{k,s,n}^{Pro}(t, \tau) = \sum_{q=1}^Q \sqrt{\alpha_{k,q}} \cdot h_{k,s,n,q}^{Pro}(t, \tau)$;
where, $\alpha_{k,q}$ denotes a weight of a q-th ray mapped to a k-th probe antenna, $\mathbb{R}$ denotes a real number, $\alpha_{k,q}\in \mathbb{R}$ indicates $\alpha_{k,q}$ is a real number, Q denotes a total number of rays in a n-th cluster, $h_{k,s,n}^{Pro}(t, \tau)$ is a transition equation from a s-th Tx antenna to the k-th probe antenna on the q-th ray of the n-th cluster;

$$h_{k,s,n,q}^{Pro}(t, \tau) = \sqrt{\frac{P_n}{Q}} \cdot F_s^V(\Omega_{n,q}^{AoD}) \cdot F_k \cdot \exp\left(j\frac{2\pi}{\lambda} r_{n,q}^{tx} \cdot d_s^{tx}\right) \cdot \exp(j\pi v_{n,q} t + j\alpha_{n,q,k}) \cdot \delta(\tau - \tau_n)$$

where, t denotes time, $\tau$ denotes a time delay, $P_n$ denotes power of the n-th cluster, $F_s^V$ denotes a vertically polarized antenna pattern of the s-th transmitting antenna of a user terminal, $\Omega_{n,q}^{AoD}$ denotes an AoD of the q-th ray of the n-th cluster, and $F_k$ denotes an ideal polarized antenna pattern of the k-th probe antenna, A denotes a wavelength, $r_{n,q}^{tx}$ denotes a spherical unit vector from transmitting antennas to $\Omega_{n,q}^{AoD}$, $d_s^{tx}$ denotes a position vector of the s-th transmitting antenna relative to the center of the user terminal, $v_{n,q}$ denotes a Doppler frequency of the q-th ray of the n-th cluster, $\alpha_{n,q,k}$ denotes a random phase of the q-th ray of the n-th cluster mapped to the k-th probe antenna, $\delta(\tau-\tau_n)$ denotes a pulse function, and $\tau_n$ denotes a delay of the n-th cluster.

In an embodiment, the procedure of determining the transition matrix of each probe antenna to the receiving antennas of the DUT may include:
calculating the transition matrix from each probe antenna to the receiving antennas of the DUT using $$v = \left\{ F_u^V(\Omega_k) \cdot \exp\left(j\frac{2\pi}{\lambda} r_k^{rx} \cdot d_u^{rx}\right) \right\} \in \mathbb{C}^{1\times K};$$

where, v denotes a transition matrix from K probe antennas to the u-th antenna of the DUT, $\mathbb{C}^{1\times K}$ denotes elements of v are complex numbers, and dimension of v is $1\times K$, $F_u^V$ denotes a vertically polarized antenna pattern of a u-th receiving antenna of the DUT, $\Omega_k$ denotes a spatial angle of the k-th probe antenna, $r_k^{rx}$ denotes a spherical unit vector of the k-th probe antenna, and $d_u^{rx}$ denotes a position vector of the u-th receiving antenna relative to the center of a base station.

In an embodiment, the procedure of using the product of the time-varying fading channel impulse response of the cluster multiplied by the transition matrix as the channel impulse response of the cluster may include:
calculating the channel impulse response of the cluster using $h_{u,s,n}^{Pro}(t, \tau) = vh_{K,s,n}^{Pro}(t, \tau)$;
where, $h_{u,s,n}^{Pro}(t, \tau)$ denotes the channel impulse response of the n-th cluster.

In a second aspect, embodiments of the present disclosure provide an apparatus of reconstructing channels, including:
a first determining module, for determining a weight matrix, the weight matrix is for emulating link characteristics of the reconstructed channel, the weight matrix includes a weight corresponding to each ray mapped to a probe antenna; in each cluster, rays mapped to each probe antenna have different weights from each other;
a calculating module, for calculating, for each cluster, a time-varying fading channel impulse response of each ray of the cluster mapped to a probe antenna based on the weight matrix, the time-varying fading channel impulse response includes a transition equation for each probe antenna describing mapping rays of a cluster to the probe antenna;
a second determining module, for determining a transition matrix from each probe antenna to receiving antennas of a device under test (DUT);
a channel impulse response obtaining module, for using a product of the time-varying fading channel impulse response of the cluster multiplied by the transition matrix as a channel impulse response of the cluster.

In an embodiment, the first determining module is for acquiring a joint space-time correlation of a target channel; determining a joint space-time correlation of the reconstructed channel; constructing a target optimization equation using the joint space-time correlation of the target channel and the joint space-time correlation of the reconstructed channel; and obtaining the weight matrix by solving the target optimization equation using a convex optimization method.

In a third aspect, embodiments of the present disclosure provide a device of reconstructing non-Kronecker structured channels, including a processor, a communication interface, a memory, and a communication bus; the processor, the communication interface, and the memory communicate with each other through the communication bus;

the memory stores computer programs;

the processor is capable of executing the computer programs stored in the memory to carry out the method according to the first aspect.

Embodiments of the present disclosure can achieve the following technical benefits.

In the method of reconstructing non-Kronecker structured channels according to embodiments of the present disclosure, rays mapped to each probe antenna have different weights, i.e., different weights are applied to the rays mapped to each probe antenna, so that when synthesizing each cluster during channel reconstruction, each probe antenna can have a differently distributed fading sequence, which can ensure that the correlation of Rx antennas is dependent on the correlation of the Tx antennas, and the correlation of the Rx antennas is dependent on the time correlation of the Tx antennas, the cross-correlation between the Rx antennas and the Tx antennas is not equal to the product of the Tx antenna correlation multiplied by the Rx antenna correlation, that is, the cross-correlation that does not meet the requirement of the Kronecker channel model which requires the cross-correlation between the Rx antennas and the Tx antennas is equal to the product of the Tx antenna correlation multiplied by the Rx antenna correlation, i.e., the reconstructed channel does not conform to the Kronecker channel model, i.e., the channel reconstruction process of the present disclosure conforms to a non-Kronecker channel model, i.e., non-Kronecker structured channel model. Since the actual target channel environment is a non-Kronecker channel, the reconstruction process that satisfies the Non-Kronecker channel model can be used to reconstruct Non-Kronecker channels, thus can improve the accuracy of channel reconstruction.

Of course, any product or method of the present disclosure does not necessarily achieve all of the advantages described above.

BRIEF DESCRIPTION OF THE DRAWINGS

To illustrate various embodiments of the present disclosure more clearly, the following is a brief introduction of the drawings referred to in the description. Apparently, the drawings in the following description are merely some embodiments of the present disclosure. For those of ordinary skill in the art, other embodiments may be obtained according to the drawings without creative work.

FIG. 3A is a flowchart illustrating a channel reconstructing method according to an embodiment of the present disclosure;

FIG. 3B is a flowchart illustrating a channel reconstructing method according to an embodiment of the present disclosure;

DESCRIPTION OF EMBODIMENTS

The technical solutions of various embodiments of the present disclosure are clearly and completely described below with reference to the accompanying drawings of the embodiments of the present disclosure. Apparently, the described embodiments are merely some of the embodiments of the present disclosure, not all of the embodiments. Based on the embodiments of the present disclosure, all other embodiments obtained by those of ordinary skill in the art without creative work are within the protection scope of the present disclosure.

The Kronecker channel model denotes many typical MIMO channels, and may be used as a general correlation model. Mathematically speaking, the Kronecker channel model is effective when two necessary and sufficient conditions are met at the same time. The first condition is that the Tx (respectively Rx) antenna correlation coefficient is independent of the Rx (respectively Tx) antenna correlation coefficient. The second condition is that the cross-correlation is equal to the product of the Tx antenna correlation and the Rx antenna correlation.

From the perspective of propagation-related conditions, since the AoA is coupled with the AoD of each ray, the AoA power spectrum of a cluster is dependent on the AoD-Doppler spectrum. In OTA radiation testing based on the OTA testing methods, the Rx antennas are not too far from each other and have same radiation pattern. Therefore, the channel reconstructed by the conventional PFS method meets the first condition of the Kronecker model. In addition, the joint space-time correlation function of the channel is derived. The results show that the time correlation of the Tx antenna is independent of the correlation of the Rx antenna because the PFS method requires the probes to be independent from each other and conform to the same distributed fading sequence. Therefore, the reconstructed OTA channel is a typical Kronecker model.

However, the geometric-based stochastic channel (GBSC) model is not Kronecker structured for not satisfying the second condition. This means that no matter how accurate the spatial characteristics of the channel reconstructed using the conventional PFS method are, the link characteristics of the analog channel are inaccurate, which may lead to problems with channel capacity, joint space-time correlation, and diversity characteristics, especially for MIMO systems with massive antenna arrays.

Specifically, the following is analysis of why the GBSC model is not a Kronecker channel model.

Figure 1:
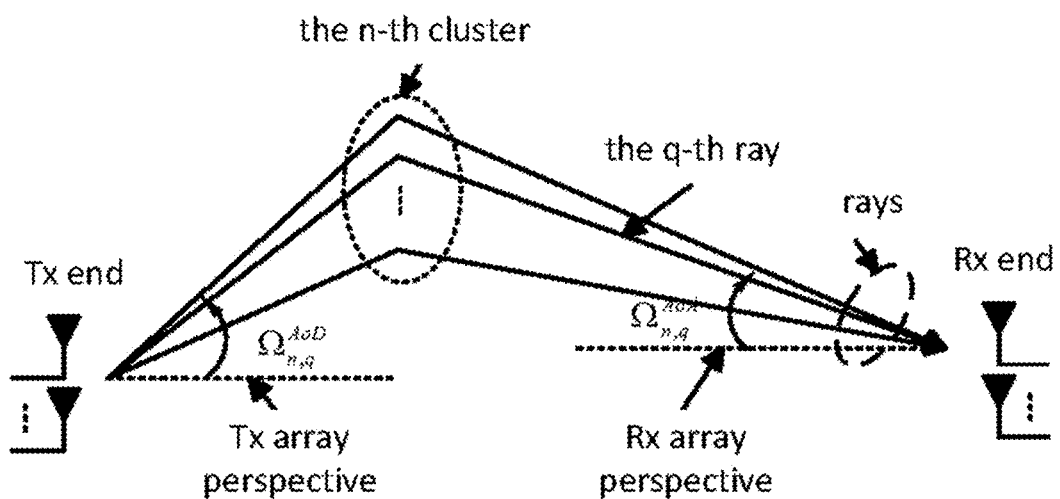
FIG. 1 illustrates the spatial structure of clusters in the GBSC model of a target channel.

The GBSC model is usually used to describe MIMO channels, and can extract the Rx antenna characteristics and the Tx antenna characteristics from a fading channel. The GBSC model is usually composed of multiple clusters. Each cluster corresponds to a path in the real propagation channel, and may be described by specific channel parameters. FIG. 1 shows the spatial structure of clusters in a GBSC model of a target channel. Referring to FIG. 1, for a MIMO link, the transmitting end (can also be referred to as the transmitter) has a Tx antenna array, and the receiving end (can also be referred to as the receiver) has a Rx antenna array. The paths between the transmitter and the receiver may be described by clusters. Each cluster may include multiple rays (or sub-paths). For example, the n-th cluster may be composed of Q rays with equal power. Each ray may have a given AoD and AoA, and may be corresponding to the scattering, or reflection or diffraction of a single scatterer in a cluster. Specifically, $\Omega_{n,q}^{AoD}$ denotes the AoD of the q-th ray of the n-th cluster, and $\Omega_{n,q}^{AoA}$ denotes the AoA of the q-th ray of the n-th cluster.

It is assumed that the Rx antenna is located in a far-field of the Tx antenna radiation. In the uplink of the MIMO system, the transmitter may be a base station, the receiver may be a user terminal. The base station may be equipped with a total number of U Rx antenna, and the user terminal may be equipped with a total number of s Tx antenna. Therefore, the channel model of the MIMO system may be defined as: $H^{tar}(t, \tau) = \{h_{u,s}^{tar}(t, \tau)\} \in \mathbb{C}^{U \times S}$, $\mathbb{C}^{U \times S}$ denotes the elements of $H^{tar}(t, \tau)$ are complex numbers, and the dimension of the matrix is U×S.

The time-variant radio channel impulse response (CIR) $h_{u,s}^{tar}(t, \tau)$ is composed of N clusters, and may be described as $h_{u,s}^{tar}(t, \tau) = \sum_{n=1}^{N} h_{u,s,n}^{tar}(t, \tau)$, t denotes the time, $\tau$ denotes the delay of the cluster, tar is the superscript of the target channel and is the abbreviation of "target", that is, $h_{u,s}^{tar}(t, \tau)$ denotes the channel response of the target channel.

In addition, for simplicity and generality, only the vertical polarization of the channel model is considered. The CIR of the n-th cluster may be modeled using power, time delay, Tx antenna characteristics, Rx antenna characteristics, Doppler characteristics, etc., and may be expressed as:

$$h_{k,s,n}^{PFS}(t, \tau) = \sqrt{\frac{P_n}{Q}} \sum_{q=1}^{Q} F_s^V(\Omega_{n,q}^{AoD}) \cdot F_u^V(\Omega_k) \cdot \exp\left(j\frac{2\pi}{\lambda} r_{n,q}^{rx} \cdot d_u^{rx}\right) \cdot \exp\left(j\frac{2\pi}{\lambda} r_{n,q}^{tx} \cdot d_s^{tx}\right) \cdot \exp(j\pi v_{n,q} t + j\alpha_{n,q,k}) \cdot \delta(\tau - \tau_n) \quad (1)$$

In the above, $h_{k,s,n}^{PFS}(t, \tau)$ denotes the channel response of the n-th cluster from the s-th Tx antenna to the k-th probe antenna, $P_n$ denotes the power of the n-th cluster, $\tau_n$ denotes the delay of the n-th cluster, Q denotes the number of rays in the n-th cluster, $F_s^V(\bullet)$ denotes the vertically polarized field pattern of the s-th antenna of the user terminal, $F_u^V(\bullet)$ denotes the vertically polarized field pattern of the u-th Rx antenna of the base station, $v_{n,q}$ denotes the Doppler frequency of the q-th ray of the n-th cluster, q=1, . . . , Q, and $\alpha_{n,q}$ is an independent and identically distributed random variable and denotes the random phase of the q-th ray of the n-th cluster, the random phase is uniformly distributed over $[0, 2\pi]$, $r_{n,q}^{rx}$ denotes the spherical unit vector from spatial angle $\Omega_{n,q}^{AoA}$ to the Rx antenna, $r_{n,q}^{tx}$ denotes the spherical unit vector of the Tx antenna relative to the spatial angle $\Omega_{n,q}^{AoD}$, $d_u^{rx}$ denotes the position vector of the u-th Rx antenna relative to the center of the base station, $d_s^{tx}$ denotes the position vector of the s-th Tx antenna relative to the center of the user terminal, $\Omega_k$ denotes the spatial angle of the k-th probe, and $\alpha_{n,q,k}$ denotes the random phase of the q-th ray of the n-th cluster mapped to the k-th probe.

Assuming that the Tx antennas are not far away from each other and have the same radiation pattern, the spatial correlation between the two Rx antennas is independent from the Tx antenna index. Conversely, the Tx antennas should also satisfy similar conditions. Therefore, the target channel satisfies the first condition of the Kronecker channel model. However, it is worth noting that the AoD and AoA of each ray are coupled with each other. That is to say, for each ray in a cluster, the AoD and fading characteristics may be observed through the corresponding AoA. It can also be explained from a statistical perspective, that is, the AoA power spectrum of each cluster should depend on the AoD-Doppler power spectrum, which does not satisfy the second condition of the Kronecker channel model. Based on the above analysis, the target channel is not a Kronecker structured channel, and this may be further confirmed through the following space-time correlation equation derivation process.

The space-time correlation coefficient of the target channel may be expressed in the sense of time average. The rays are usually statistically independent of each other, expected value of the product of any two rays is zero except when q=q'. According to the above formula (1), under different Tx antennas and time samples, where i=1, . . . , U, j=1, . . . , S and m=1, . . . , M, the joint space-time correlation coefficient of the n-th cluster for an arbitrary Rx antenna pair $(u_1, u_i)$ may be derived as:

$$R_t^{tar}(u_1, s_1, t_1; u_i, s_j, t_m) = \quad (2)$$
$$E\{h_{u_1,s_1,n}^{tar}(t_1), h_{u_i,s_j,n}^{tar}(t_m)^*\} = \frac{P_n}{Q} \sum_{q=1}^{Q} F_{s_1,s_j,q}^{tar} \cdot F_{u_1,u_j,q}^{tar} \cdot \Phi_{t_1,t_m,q}^{tar}$$

where, $$F_{u_1,u_i,q}^{tar} \triangleq F_{u_1}^V(\Omega_{n,q}^{AoA}) \cdot F_{u_i}^V(\Omega_{n,q}^{AoA})^* \cdot \exp\left(j\frac{2\pi}{\lambda} r_{n,q}^{rx} \cdot d_{u_1}^{rx}\right) \cdot \exp\left(j\frac{2\pi}{\lambda} r_{n,q}^{rx} \cdot d_{u_i}^{rx}\right)^*$$

$$F_{s_1,s_j,q}^{PFS} \triangleq F_{s_1}^V(\Omega_{n,q}^{AoD}) \cdot F_{s_j}^V(\Omega_{n,q}^{AoD})^* \cdot \exp\left(j\frac{2\pi}{\lambda} r_{n,q}^{rx} \cdot d_{s_1}^{rx}\right) \cdot \exp\left(j\frac{2\pi}{\lambda} r_{n,q}^{rx} \cdot d_{s_j}^{rx}\right)^*$$

$$\Phi_{t_1,t_m,q}^{PFS} \triangleq \exp(j2\pi \vartheta_{n,q} t_1) \cdot \exp(j2\pi \vartheta_{n,q} t_m)^*$$

denotes the Doppler frequency of the q-th ray of the n-th cluster.

For U antennas at the Rx side, the joint space-time correlation matrix of the MIMO channel may be defined as:

$\hat{R}_t^{tar}(u_1,s_1,t_1;u_i,s_j,t_m) = \{R_t^{tar}(u_1,s_1,t_1;u_i,s_j,t_m)\}$
$\in \mathbb{C}^{U \times S \times M}$.

$\mathbb{C}^{U \times S \times M}$ denotes that the elements of $\hat{R}_t^{tar}(u_1, s_1, t_1; u_i, s_j, t_m)$ are complex numbers, and the dimension of $\hat{R}_t^{tar}(u_1, s_1, t_1; u_i, s_j, t_m)$ is U×S×M.

Suppose the isotropic antennas equipped at the Tx side and the Rx side are omni-directional, and thus $|F_s(\bullet)|=1$ for any Tx antenna s and $|F_u(\bullet)|=1$ for any Rx antenna u. When $P_n=1$, it is apparent that the space-time correlation coefficient of the target channel may be $R_t^{tar}(u_i, s_1, t_1; u_i, s_j, t_m)=1$ if $s_1=s_j$, $u_1=u_i$ and $t_1=t_m$. As shown in the above formula (1), the target channel satisfies the first condition of the Kronecker channel model. However, the second condition of the Kronecker channel model is not satisfied, that is, the joint space-time correlation coefficient equals the product of the Tx antenna-time correlation coefficient and the Rx antenna correlation coefficient. Specifically, when $u_1=u_i$, the correlation coefficient of the joint Tx antenna-Doppler domain may be expressed as $$R_t^{tar}(u_1; u_i) = \frac{1}{Q} \sum_{q=1}^{Q} F_{u_1,u_j,q}^{tar}.$$

When $s_1=s_j$ and $t_1=t_m$, the correlation coefficient in the Rx antenna domain may be expressed as $$R_t^{tar}(u_1; u_i) = \frac{1}{Q}\sum_{q=1}^{Q} F_{u_1,u_j,q}^{tar}.$$

Through the above analysis, since the second condition of the Kronecker model cannot be satisfied, i.e., $R_t^{tar}(u_1, s_1, t_1; u_i, s_j, t_m) \neq R_t^{tar}(s_1, t_1; s_j, t_m) \cdot R_t^{tar}(u_i; u_i)$, the target channel is not Kronecker structured.

Figure 2:
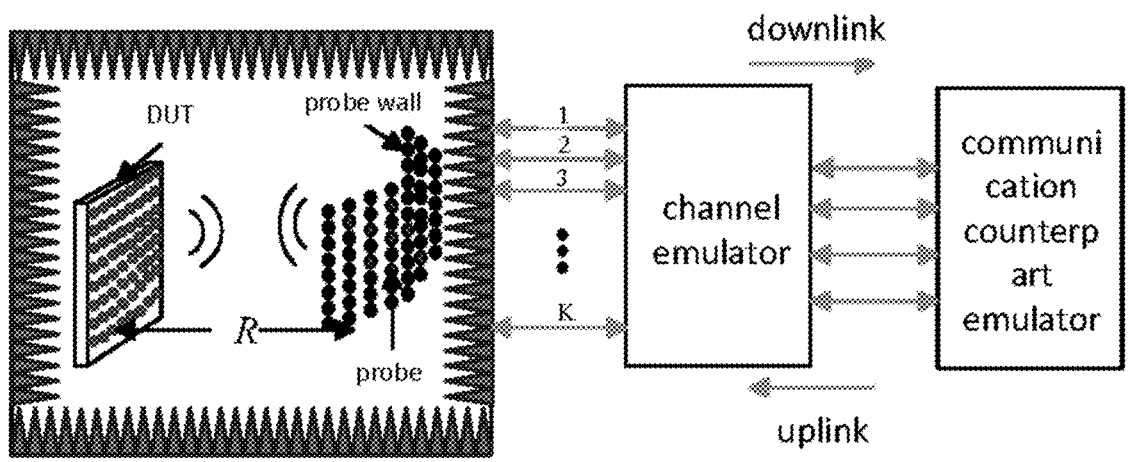
FIG. 2 is a schematic diagram illustrating the structure of an OTA testing system.

In OTA testing, the channel reconstruction methods may be used to reconstruct the spatial profiles of all clusters of the target channel. When multiple probe antennas are used in simulating a cluster with a specific delay, the fading sequence mapped to each probe antenna is independent of each other and identically distributed. In the OTA testing system as shown in FIG. 2, the fading channel from a communication counterpart to a device under test (DUT) is emulated in a darkroom equipment with multiple probes. In some embodiments, the OTA testing system may be used as an OTA testing system for massive MIMO base stations. The OTA testing system includes a dark room (the device under test (DUT) and the probe wall are in the dark room), a channel emulator, and a communication counterpart emulator. The probe wall includes a set of probe antennas (i.e., the probes as shown in FIG. 2). In an embodiment, the DUT may be a base station, the communication counterpart emulator may be a user terminal. In another embodiment, the DUT may be a user terminal, the communication counterpart emulator may be a base station. The user terminal may serve as the transmitting end, and the base station may serve as the receiving end, and this situation may be regarded as uplink. The base station may serve as the transmitting end, the user terminal may serve as the receiving end, and this situation may be regarded as downlink. In FIG. 2, R denotes the distance between the DUT and the probe wall, and K denotes the number of probe antennas. Referring to FIG. 2, taking into consideration the angular power spectrum of the target channel and the limited number of probe antennas, the discrete angular power spectrum may be synthesized by assigning appropriate weights to the active probes. The channel emulator is respectively connected to the communication counterpart and transmitting antennas, and is capable of generating an individual output for each OTA antenna using channel parameters conforming to a predefined channel model, so as to establish a radio frequency (RF) environment as needed. Through the PFS method, the characteristics of each cluster, such as the spatial correlation, the Doppler spectrum, the power delay profile (PDP), etc., may be accurately emulated in the test area.

The target channel may be emulated in a multi-probe anechoic chamber to evaluate the performance of the DUT. It may be assumed that the DUT, such as a base station, is located at the center of the test area and is located in the far field of the OTA antenna radiation. Given a multi-probe anechoic room equipped with a total of K probe antennas, the channel matrix $H^{PFS}(t, \tau)=\{h_{u,s}^{PFS}(t, \tau)\}\in\mathbb{C}^{U\times S}$ may be composed of a transition matrix from the K probe antennas to a total of U Rx antennas of the DUT, denoted by $$V = \left\{F_u^v(\Omega_k)\cdot\exp\left(j\frac{2\pi}{\lambda}r_k^{rx}\cdot d_k^{rx}\right)\right\}\in\mathbb{C}^{U\times K},$$

and a time-varying fading channel impulse response denoted by $H_{K,S}^{PFS}(t, \tau)=\{\Sigma_{n=1}^{N} h_{k,s,n}^{PFS}(t, \tau)\}\in\mathbb{C}_{K\times S}$. Therefore, the channel impulse response of the n-th cluster is:

$$h_{k,s,n}^{PFS}(t, \tau) = \sum_{k=1}^{K}\sqrt{w_k}F_u^V(\Omega_k)\cdot\exp\left(j\frac{2\pi}{\lambda}r_k^{rx}\cdot d_k^{rx}\right)\cdot\sqrt{\frac{P_n}{Q}} \quad (3)$$

$$\sum_{q=1}^{Q}F_s^V(\Omega_{n,q}^{AoD})\cdot F_k\cdot\exp\left(j\frac{2\pi}{\lambda}r_{n,q}^{rx}\cdot d_s^{rx}\right)\cdot\exp(j\pi v_{n,q}t + j\alpha_{n,q,k})\cdot\delta(\tau-\tau_n),$$

In the formula (3), $w_k$ denotes the weight of the k-th probe antenna, $F_k$ denotes the ideal antenna pattern of the k-th probe antenna, $\Omega_k$ denotes the spatial angle of the k-th probe antenna, and $\alpha_{n,q,k}$ denotes the random phase of the q-th ray mapped to the n-th cluster of the k-th probe antenna, which is uniformly distributed over $[0,2\pi]$. The fading sequences mapped to the probes are independent of each other and identically distributed. The $\mathbb{C}_{U\times K}$ represents the elements of V are complex numbers, and the dimension of V is U×K.

Similar to the target channel, the channel model reconstructed using the PFS method also satisfies the first condition of the Kronecker channel model. However, it is worth noting that, unlike the target channel, the AoD-Doppler characteristics of each cluster is coupled with the AoA of each ray. More intuitively, the same AoD-Doppler spectrum of a cluster can be observed from the AoA of each ray at the Rx side, and therefore, any given AoD-Doppler cannot provide any information about the AoA, which is completely different from the target channel model. Therefore, under the conventional PFS method, the AoA power spectrum of the reconstructed channel is independent of the AoD-Doppler power spectrum, which can be confirmed by the following space-time correlation equation derivation process.

The rays are statistically independent from each other, and the fading sequences mapped to the probes are also statistically independent from each other, the expected value of the product of any two of the fading sequences is zero except when k=k' and q=q'. The joint space-time correlation coefficient of the reconstructed channel under the PFS method may be obtained in the sense of time average as:

$$\hat{R}_t^{PFS}(u_1, s_1, t_1; u_i, s_j, t_m) = \quad (4)$$

$$E\left\{h_{u_1,s_1,n}^{PFS}(t_1), h_{u_i,s_j,n}^{PFS}(t_m)^*\right\} = \frac{1}{Q}\sum_{q=1}^{Q} F_{s_1,s_j,q}^{PFS}\cdot\Phi_{t_1,t_j,q}^{PFS}\cdot\sum_{k=1}^{K} F_{u_1,u_j,k}^{PFS}\cdot w_k$$

where, $$F_{u_1,u_i,k}^{PFS} \triangleq F_{u_1}^V(\Omega_k)\cdot F_{u_1}^V(\Omega_k)^*\cdot\exp\left(j\frac{2\pi}{\lambda}r_k^{rx}\cdot d_{u_1}^{rx}\right)\cdot\exp\left(j\frac{2\pi}{\lambda}r_k^{rx}\cdot d_{u_1}^{rx}\right)^*$$

$$F_{s_1,s_i,k}^{PFS} \triangleq F_{s_1}^V(\Omega_{n,q}^{AoD})\cdot F_{s_j}^V(\Omega_{n,q}^{AoD})^*\cdot\exp\left(j\frac{2\pi}{\lambda}r_{n,q}^{rx}\cdot d_{u_1}^{rx}\right)\cdot\exp\left(j\frac{2\pi}{\lambda}r_{n,q}^{rx}\cdot d_{s_j}^{rx}\right)^*$$

$$\Phi_{t_1,t_m,q}^{PFS} \triangleq \exp(j2\pi\vartheta_{n,q}t_1)\cdot\exp(j2\pi\vartheta_{n,q}t_m)^*$$

The probe antenna weight $w_k$ may be obtained by minimizing the deviation between the spatial-correlation of the target channel and the spatial-correlation of the reconstructed channel. For Rx antennas whose total number is U, the joint space-time correlation matrix based on the conventional PFS method may be defined as $\hat{R}_t^{PFS}(u_1, s_1, t_1; u_i, s_j, t_m)=\{\hat{R}_t^{PFS}(u_1, s_1, t_1; u_i, s_j, t_m)\}\in\mathbb{C}_{U\times S\times M}$.

Similar to the GBSC model, the first condition of the Kronecker channel model is also applicable to the channel reconstructed using the PFS method. Furthermore, when $u_1=u_i$, the joint correlation coefficient of the Tx antenna-Doppler domain is $$\hat{R}_t^{PFS}(s_1, t_1; s_j, t_m) = \frac{1}{Q}\sum_{q=1}^{Q} F_{s_1,s_j,q}^{PFS} \cdot \Phi_{s_1,s_j,q}^{PFS}.$$

When $s_1=s_j$ and $t_1=t_m$, the correlation coefficient in the Rx antenna domain is $\hat{R}_t^{PFS}(u_1; u_i)=\Sigma_{k=1}^{K} F_{u_1,u_j,k}^{PFS} \cdot w_k$.

Since the cross-correlation coefficient satisfies $\hat{R}_t^{PFS}(u_1, s_1, t_1; u_i, s_j, t_m)=\hat{R}_t^{PFS}(s_1, t_1; s_j, t_m)\cdot\hat{R}_t^{PFS}(u_1; u_i)$, the channel reconstructed using the conventional PFS method also satisfies the second condition of the Kronecker channel model. Reasons include that the conventional PFS method cannot reflect the coupling relationship between each AoD and the AoA of each ray, but requires the active probe antenna have an independent and identically distributed fading sequence and the same AoD-Doppler power spectrum of each cluster can be observed from the AoA of each ray of the same cluster, which leads to the independence between the spatial correlation of Rx antennas and the time correlation of Tx antennas. Therefore, the target channel reconstructed using the conventional PFS method is a typical Kronecker channel model.

Through the above analysis, since the two sufficient conditions of the Kronecker channel model are satisfied, the target channel reconstructed using the conventional PFS method is the Kronecker channel model, having characteristics different from those of the structure model of a actual target channel. More directly, even if the spatial characteristics of the target channel are accurately reproduced in the OTA testing, the OTA channel reconstructed using the PFS method cannot accurately emulate the GBSC model, especially its link characteristics. Specifically, the reconstructed channel model with the Kronecker structure may underestimate the mutual information of the MIMO system and overestimate the diversity measure of the channel, especially in the evaluation of the performances of a device with a massive antenna array.

In view of the above, the channel reconstructed using the conventional PFS method is a typical Kronecker channel model. However, the actual target channel radio environment is Non-Kronecker model. Therefore, based on the conventional PFS channel reconstruction method, in a first aspect, when synthesizing a target channel, the probes are required to be independent of each other and identically distributed, which makes the time correlation of the Tx antennas and the spatial correlation of the Rx antennas are independent of each other, and thus it is impossible to reconstruct the target channel accurately. In a second aspect, no matter how accurate the reconstructed spatial characteristics are, the emulated channel link characteristics are inaccurate, which will affect the channel capacity, joint space-time correlation and diversity characteristics of the reconstructed channel, especially for testing massive MIMO devices. In general, the channel reconstructed using the conventional PFS method is a typical Kronecker channel model, and the actual target channel radio environment is Non-Kronecker structured. Reconstructing the target channel of the Non-Kronecker channel model using the typical Kronecker channel model nay lead to inaccuracy of the reconstructed target channel.

In view of the disadvantages of the conventional PFS-based target channel reconstruction method and the deficiencies in the massive MIMO OTA test process, various embodiments of the present disclosure provide a channel reconstruction scheme which can overcome the existing disadvantages of conventional channel reconstruction method by improving the link structure of the reconstructed channel in the OTA test, and may be applied in massive MIMO OTA test systems.

Various embodiments of the present disclosure provide a method of reconstructing non-Kronecker structured channels, which may include:
  determining a weight matrix, the weight matrix is for emulating link characteristics of a reconstructed channel; the weight matrix includes a weight corresponding to a ray mapped to each probe antenna; for each cluster, rays in the cluster are mapped to probe antennas with different weights;
  calculating, for each cluster, a time-varying fading channel impulse response of each ray of the cluster mapped to a probe antenna based on the weight matrix; the time-varying fading channel impulse response includes a transition equation of each probe antenna describing rays of a cluster mapping to the probe antenna;
  determining a transition matrix from each probe antenna to a Rx antenna of a DUT;
  determining a product of multiplying the time-varying fading channel impulse response of the cluster by the transition matrix is used as the channel impulse response corresponding to the cluster.

In various embodiments of the present disclosure, the rays mapped to each probe antenna are corresponding to different weights, that is, different weights are applied to the rays mapped to each probe antenna. As such, when combining each cluster to reconstruct a channel, each probe antenna may have a differently distributed fading sequence, which can ensure that the correlation of the Rx antennas is dependent on the correlation of the Tx antennas while the correlation of the Rx antennas is dependent on the time correlation of the Tx antennas, thus the cross-correlation between the Rx antennas and the Tx antennas is not equal to the product of the correlation of the Tx antenna and the correlation of the Rx antenna. That is, the condition of the Kronecker channel model which requires that the cross-correlation is equal to the product of the Tx antenna correlation and the Rx antenna correlation is not satisfied, i.e., the channel reconstruction process of the present disclosure conforms to the Non-Kronecker channel model. The actual target channel radio environment is Non-Kronecker channel, thus the Non-Kronecker channel can be reconstructed by implementing the process which conforms to the Non-Kronecker channel model, and the reconstruction process can improve the accuracy of the reconstructed channel.

Embodiments of the present disclosure provides a method of reconstructing non-Kronecker structured channels, as shown in FIG. 3A. The method may be applied to an OTA testing system, e.g., the system as shown in FIG. 2, and may be implemented by a channel emulator. The method may include the following procedures.

S301: Determine a weight matrix.

The weight matrix is for emulating link characteristics of the reconstructed channel. The weight matrix includes the weight corresponding to each ray mapped to a probe antenna. In each cluster, the weights of rays mapped to each probe antenna are different from each other.

S302: For each cluster, a time-varying fading channel impulse response of each ray of the cluster mapped to a probe antenna is calculate based on the weight matrix.

For multiple clusters each of which includes multiple rays, each cluster is corresponding to a path in the actual propagation channel.

The time-varying fading channel impulse response includes a transition equation for each probe antenna describing rays of a cluster mapping to the probe antenna.

Specifically, the transition equation $h_{k,s,n}^{Pro}(t, \tau)$ of each probe antenna which describes rays in the cluster mapping to the probe antenna may be calculated through the formula $h_{k,s,n}^{Pro}(t, \tau) = \Sigma_{q=1}^{Q} \sqrt{\alpha_{k,q}} \cdot h_{k,s,n,q}^{Pro}(t, \tau)$;

where, $\alpha_{k,q}$ denotes the weight of the q-th ray mapped to the k-th probe antenna, $\mathbb{R}$ denotes a real number, $\alpha_{k,q} \in \mathbb{R}$ denotes $\alpha_{k,q}$ is a real number, $\alpha_{k,q} \geq 0$, Q denotes the number of rays in the n-th cluster, $h_{k,s,n,q}^{Pro}$ denotes the transition equation from the s-th Tx antenna to the k-th probe antenna in the q-th ray of the n-th cluster;

$$h_{k,s,n,q}^{Pro}(t, \tau) = \sqrt{\frac{P_n}{Q}} \cdot F_s^V(\Omega_{n,q}^{AoD}) \cdot F_k \cdot \exp\left(j\frac{2\pi}{\lambda} r_{n,q}^{tx} \cdot d_{u_1}^{tx}\right) \cdot \exp(j\pi v_{n,q} t + j\alpha_{n,q,k}) \cdot \delta(\tau - \tau_n)$$

where, t denotes the time, $\tau$ denotes the time delay, $P_n$ denotes the power of the n-th cluster, $F_s^V$ denotes the vertically polarized antenna pattern of the s-th Tx antenna of the user terminal, $\Omega_{n,q}^{AoD}$ denotes the AoD of the q-th ray of the n-th cluster, and $F_k$ denotes the ideal polarized antenna pattern of the k-th probe, $\lambda$ denotes the wavelength, $r_{n,q}^{tx}$ denotes the spherical unit vector from a Tx antenna to $\Omega_{n,q}^{AoD}$, $d_s^{tx}$ denotes the position vector of the s-th Tx antenna relative to the center of the user terminal, $\upsilon_{n,q}$ denotes the Doppler frequency of the q-th ray of the n-th cluster, $\alpha_{n,q,k}$ denotes the random phase of the q-th ray of the n-th cluster mapped to the k-th probe, $\delta(\tau - \tau_n)$ denotes a pulse function, and $\tau_n$ denotes the delay of the n-th cluster.

S303: A transition matrix from each probe antenna to the Rx antenna of the DUT is determined.

The transition matrix from each probe antenna to the Rx antenna of the DUT may be calculated through the formula $$v = \left\{ F_u^V(\Omega_k) \cdot \exp\left(j\frac{2\pi}{\lambda} r_{n,q}^{rx} \cdot d_{u_1}^{rx}\right) \right\} \in \mathbb{C}^{1 \times K};$$

where, v denotes the transition matrix from the K probe antennas to the u-th antenna of the DUT, $\mathbb{C}^{1 \times K}$ denotes the elements of v are complex numbers, and the dimension of v is 1×K, $F_u^V$ denotes the vertically polarized antenna pattern of the u-th Rx antenna of the DUT, $\Omega_k$ denotes the spatial angle of the k-th probe antenna, $r_k^{rx}$ denotes the spherical unit vector of the k-th probe antenna, and $d_u^{rx}$ denotes the position vector of the u-th Rx antenna relative to the center of the base station.

S304: The product of multiplying the time-varying fading channel impulse response of the cluster by the transition matrix is used as the channel impulse response of the cluster.

Specifically, the channel impulse response of the cluster may be calculated through the formula $h_{u,s,n}^{Pro}(t, \tau) = vh_{K,s,n}^{Pro}(t, \tau)$;

where, $h_{u,s,n}^{Pro}(t, \tau)$ denotes the channel impulse response of the n-th cluster.

Embodiments of the present disclosure provides a method of reconstructing non-Kronecker structured channels. The method may be executed by a channel emulator which is connected to a communication counterpart of a DUT and transmitting antennas of a testing system. The method may include:

generating an output for each of the transmitting antennas of the testing system by processing signals from the communication counterpart using a channel impulse response which is determined by:

determining a weight matrix, the weight matrix is for emulating link characteristics of a reconstructed channel, the weight matrix includes a weight corresponding to each ray mapped to a probe antenna; in each cluster, rays mapped to each probe antenna have different weights with each other;

calculating, for each cluster, a time-varying fading channel impulse response of each ray of a cluster mapped to a probe antenna based on the weight matrix; the time-varying fading channel impulse response includes a transition equation for each probe antenna describing mapping of rays of the cluster to the probe antenna;

determining a transition matrix from each probe antenna to receiving antennas of the DUT;

using a product of the time-varying fading channel impulse response of the cluster multiplied by the transition matrix as a channel impulse response of the cluster.

Method steps of various embodiments may be implemented by one physical device or by multiple physical devices in a distributed manner.

For example, as shown in FIG. 3B, the method may be executed by a channel emulator as follows. The channel emulator may carry out the procedures in S301 to S304. Then, in S305, the channel emulator may generate an output for each of the transmitting antennas of the testing system by processing signals from the communication counterpart using the channel impulse response obtained in S304.

Figure 5A:
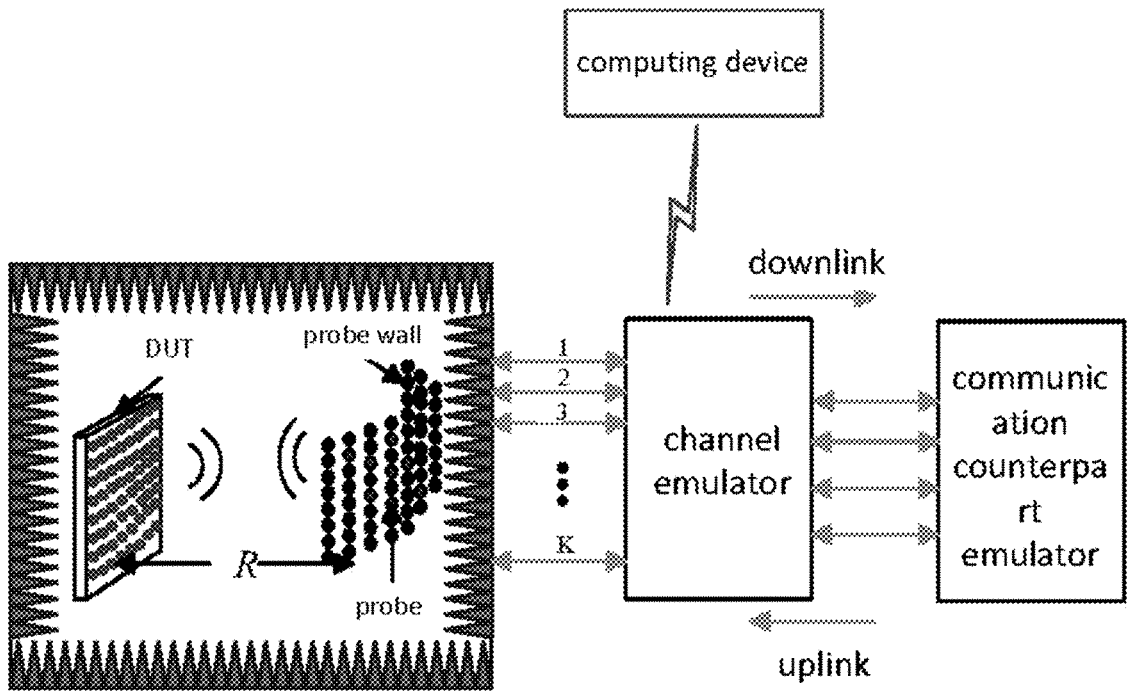
FIG. 5A is a schematic diagram illustrating the structure of an OTA testing system.

In another example, the method may be executed by a standalone computing device and a channel emulator which may be physically located at different places and capable of communicating with each other directly or via other devices, as shown in FIG. 5A. The computing device may carry out the procedures in S301 to S304. The channel emulator may obtain the channel impulse response generated by the computing device, and in S305, generate an output for each of the transmitting antennas of the testing system by processing signals from the communication counterpart using the channel impulse response. In an embodiment, the channel impulse response generated by the computing device may be stored in a storage device, and the channel emulator may access the storage device to obtain the channel impulse response.

Figure 4:
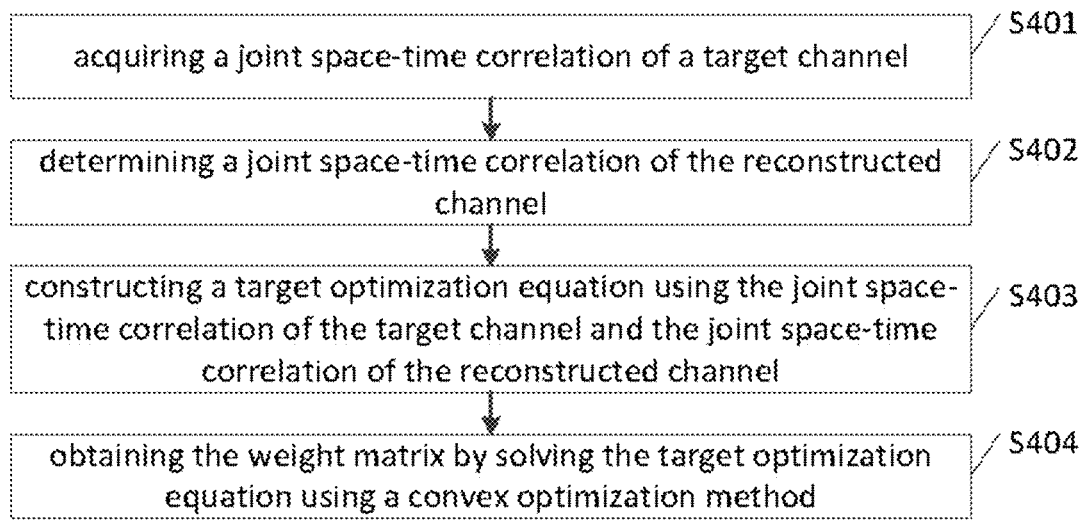
FIG. 4 is a flowchart illustrating determining a weight matrix according to an embodiment of the present disclosure.

Based on the embodiment as shown in FIG. 3A and FIG. 3B, embodiment of the present disclosure may optimize the weight matrix. As shown in FIG. 4, the procedure of determining the weight matrix may include the following procedures.

S401: The joint space-time correlation of the target channel may be acquired.

As mentioned above, the joint space-time correlation coefficient of the target channel may be obtained based on the GBSC model as $R_t^{tar}(u_1, s_1, t_1; u_i, s_j, t_m)$.

S402: The joint space-time correlation of the reconstructed channel may be determined.

Based on the channel impulse response of each cluster at different time points, the joint space-time correlation $\hat{R}_t^{Pro}(u_1, s_1, t_1; u_i, s_j, t_m)$ of the reconstructed channel may be calculated through the formula: $\hat{R}_t^{Pro}(u_1, s_1, t_1; u_i, s_j, t_m) = \{\hat{R}_t^{Pro}(u_1, s_1, t_1; u_i, s_j, t_m)\} \in \mathbb{C}^{U \times S \times M}$;

where, $$\hat{R}_t^{PrO}(u_1, s_1, t_1; u_i, s_j, t_m) = \frac{1}{Q}\sum_{k=1}^{K} F_{u_1,u_i,k}^{PrO} \sum_{q=1}^{Q} \alpha_{k,q} \cdot F_{s_1,s_j,q}^{PrO} \cdot \Phi_{t_1,t_j,q}^{PrO}$$

where, $$F_{u_1,u_i,k}^{PrO} \triangleq F_{u_1}^V(\Omega_k) \cdot F_{u_1}^V(\Omega_k)^* \cdot \exp\left(j\frac{2\pi}{\lambda}r_k^{rx} \cdot d_{u_1}^{rx}\right) \cdot \exp\left(j\frac{2\pi}{\lambda}r_k^{rx} \cdot d_{u_1}^{rx}\right)^*$$

$$F_{s_1,s_j,q}^{PrO} \triangleq F_{s_1}^V(\Omega_{n,q}^{AoD}) \cdot F_{s_j}^V(\Omega_{n,q}^{AoD})^* \cdot \exp\left(j\frac{2\pi}{\lambda}r_{n,q}^{tx} \cdot d_{s_1}^{tx}\right) \cdot \exp\left(j\frac{2\pi}{\lambda}r_{n,q}^{tx} \cdot d_{s_j}^{tx}\right)^*$$

$$\Phi_{t_1,t_m,q}^{PrO} \triangleq \exp(j2\pi\vartheta_{n,q}t_1) \cdot \exp(j2\pi\vartheta_{n,q}t_m)^*$$

where, $F_{u_1,u_i,k}^{Pro}$ denotes the correlation between Rx antennas relative to the k-th probe antenna, $F_{u_1}^V$ denotes the vertically polarized antenna pattern of the $u_1$-th receiving antenna of the DUT, $F_{u_i}^V$ denotes the vertically polarized antenna pattern of the $u_i$-th receiving antenna of the DUT, $\Omega_k$ denotes the spatial angle of the k-th probe antenna, $r_k^{rx}$ denotes the spherical unit vector of the k-th probe antenna, $d_{u_1}^{rx}$ denotes the position vector of the $u_1$-th Rx antenna relative to the center of the base station, $F_{s_1,s_j,q}^{Pro}$ denotes the correlation between Tx antennas relative to the q-th ray, $F_{s_1}^V$ denotes the vertically polarized antenna pattern of the $s_1$-th Tx antenna of the user terminal, $\Omega_{n,q}^{AoD}$ denotes the AoD of the q-th ray of the n-th cluster, $F_{s_j}^V$ denotes the vertically polarized antenna pattern of the $s_j$-th Tx antenna of the user terminal, $r_{n,q}^{tx}$ denotes the spherical unit vector of the Tx antenna to $\Omega_{n,q}^{AoD}$, $d_{s_j}^{rx}$ denotes the position vector of the $s_j$-th Tx antenna relative to the center of the user terminal, $\Phi_{t_1,t_m,q}^{Pro}$ denotes the correlation function of the q-th ray of the n-th cluster at time point $t_1$ and time point $t_m$, $\vartheta_{n,q}$ denotes the Doppler frequency of the q-th ray of the n-th cluster, $\mathbb{C}$ denotes a complex number, $\mathbb{C}^{U \times S \times M}$ denotes the elements of the matrix $\hat{R}_t^{Pro}(u_1, s_1, t_1; u_i, s_j, t_m)$ are complex numbers, and the dimension of the matrix is U×S×M.

S403: A target optimization equation may be constructed according to the joint space-time correlation of the target channel and the joint space-time correlation of the reconstructed channel.

S404: A weight matrix may be obtained by solving the target optimization equation using a convex optimization method.

According to the joint space-time correlation of the target channel and the joint space-time correlation of the reconstructed channel, the target optimization equation may be constructed $$\text{as } \min_G \left\| R_t(u_1, s_1, t_1; u_i, s_j, t_m) - \hat{R}_t^{PrO}(u_1, s_1, t_1; u_i, s_j, t_m; G) \right\|_2^2;$$

where, $R_t(u_1, s_1, t_1; u_i, s_j, t_m)$ denotes the joint space-time correlation of the target channel, $\hat{R}_t^{Pro}(u_1, s_1, t_1; u_i, s_j, t_m; G)$ denotes the joint space-time correlation of the reconstructed channel, and G is the weight matrix.

Based on the above analysis, for each cluster of the target channel, there is a specific correlation between the AoA power spectrum and the AoD-Doppler spectrum. Therefore, the conventional PFS-based channel reconstruction method has an unrealistic factor, that is, a Kronecker structured channel model is reconstructed in the test domain. Therefore, the conventional PFS-based method cannot accurately reconstruct the link characteristics of the fading channel.

Various embodiments of the present disclosure provide a method of reconstructing PFS channels based on the Non-Kronecker structure. Different from the conventional PFS-based method, the channel reconstruction method according to the embodiments of the present disclosure only requires the fading channel sequences mapped to the probe antennas are independent from each other, not necessarily identically distributed. Specifically, different weights are applied to the rays mapped to each probe antenna. Therefore, when synthesizing each cluster, each probe antenna may have a differently distributed fading sequence. The dependence of the AoA power spectrum on the AoD-Doppler spectrum of each cluster may be emulated by adjusting the weight of each ray to be as accurate as possible.

The space-time channel reconstruction method is applicable to evaluation of the performance of massive MIMO devices, that is, each ray in the cluster mapped to a probe is weighted individually, and on such basis, a MIMO device is tested. The performance of OTA testing of massive MIMO devices can be optimized by determining the weight of each ray mapped to a probe to accurately reconstruct the various characteristics of the spatial channel. The channel reconstruction method according to the embodiments of the present disclosure may be understood as a method of reconstructing non-Kronecker structured pre-fading OTA channel with multiple probes.

Based on the OTA testing system as shown in FIG. 2, it may be assumed that the base station under test is placed at a far-field position of the probe antenna, for the q-th ray of the n-th cluster, the transition equation from the s-th Tx antenna to the k-th probe antenna may be:

$$h_{k,s,n,q}^{PrO}(t, \tau) = \sqrt{\frac{P_n}{Q}} \cdot F_s^V(\Omega_{n,q}^{AoD}) \cdot F_k \cdot \exp\left(j\frac{2\pi}{\lambda}r_{n,q}^{tx} \cdot d_s^{tx}\right) \cdot \exp(j\pi v_{n,q} t + j\alpha_{n,q,k}) \cdot \delta(\tau - \tau_n)$$

For the n-th cluster, the transition equation from the s-th Tx antenna to the n-th cluster of the k-th probe antenna may be obtained by applying weights to all of the rays mapped to each probe antenna as:

$$h_{k,s,n}^{PrO}(t, \tau) = \sum_{q=1}^{Q} \sqrt{\alpha_{k,q}} \cdot h_{k,s,n,q}^{PrO}(t, \tau)$$

where, $\alpha_{k,q} \in \mathbb{R}$ denotes the weight of the q-th ray mapped to the k-th probe antenna. According to the transition equation from the s-th Tx antenna to the k-th cluster of the k-th probe antenna, i.e., $h_{k,s,n}^{Pro}(t, \tau) = \sum_{q=1}^{Q} \sqrt{\alpha_{k,q}} \cdot h_{k,s,n,q}^{Pro}(t, \tau)$, the Q rays mapped to the k-th probe antenna are multiplied respectively by corresponding weights. For the K probe antennas, the weight matrix is $G = \{\alpha_{k,q}\} \in \mathbb{C}^{K \times Q}$. Since phase correction is not necessary when synthesizing the target channel, it may be obtained that the weight of each ray is not smaller than 0, that is, $\alpha_{k,q} \geq 0$.

For a multi-probe darkroom device equipped with K probe antennas, the channel impulse response of the n-th cluster, i.e., $h_{u,s,n}^{Pro}(t, \tau) \in \mathbb{C}$, is composed of the transition matrix from the K probes to the u-th antenna of the DUT, i.e., $$v = \left\{ F_u^V(\Omega_k) \cdot \exp\left(j\frac{2\pi}{\lambda} r_k^{rx} \cdot d_u^{rx}\right) \right\} \in \mathbb{C}^{1 \times K},$$

and the time-varying fading channel impulse response $h_{K,s,n}^{Pro}(t, \tau) \in \mathbb{C}^{K \times 1}$, that is, the channel impulse response of the n-th cluster may be:

$$h_{u,s,n}^{Pro}(t,\tau) = v h_{K,s,n}^{Pro}(t,\tau)$$

Similar to the conventional PFS-based channel reconstruction method, the channel reconstruction method according to the embodiments of the present disclosure also satisfies the first condition of the Kronecker structure. In the above steps, influenced by the ray weights $\{\alpha_{k,q}\}$, active probe antennas can have differently distributed fading sequences. Therefore, the correlation of the Rx antennas is dependent on the rays mapped to the probe antennas. In other words, any given AoD-Doppler information can provide some necessary information for the corresponding AoA. Therefore, it can be understood that the channel reconstruction method according to the embodiments of the present disclosure is a Non-Kronecker structured PFS method. Under the Non-Kronecker structured PFS method, proper weights may be added to rays when reconstructing the channel to take into consideration the dependence of the AoA power spectrum on the AoD-Doppler spectrum of the cluster.

By adjusting the weights of rays mapped to the probe antennas, the link characteristics of the target channel may be emulated. The transmitting power of each probe antenna may be calibrated to ensure that the signal power of each probe antenna transmitted through the anechoic chamber space to the center of the test area is at the same level.

Similar to the joint space-time correlation of the actual target channel, the space-time correlation of the channel reconstructed using the Non-Kronecker structured PFS synthesis method of embodiments of the present disclosure may be derived from the perspective of time average as:

$$\hat{R}_t^{PrO}(u_1, s_1, t_1; u_i, s_j, t_m) =$$

$$E\left\{h_{u_1,s_1,n}^{PrO}(t_1), h_{u_i,s_j,n}^{PrO}(t_m)^*\right\} = \frac{1}{Q}\sum_{k=1}^{K} F_{u_1,u_j,k}^{PrO} \sum_{q=1}^{Q} \alpha_{k,q} \cdot F_{s_1,s_j,q}^{PrO} \cdot \Phi_{t_1,t_j,q}^{PrO}$$

For U Rx antennas, the channel reconstructed using the Non-Kronecker structured PFS synthesis method according to embodiments of the present disclosure may be expressed as: $\hat{R}_t^{Pro}(u_1, s_1, t_1; u_i, s_j, t_m) = \{\hat{R}_t^{Pro}(u_1, s_1, t_1; u_i, s_j, t_m)\} \in \mathbb{C}^{U \times S \times M}$.

Through the above derivation, it is clear that the joint space-time correlation is not equal to the product of the Tx antenna-time correlation multiplied by the Rx antenna correlation, i.e., $\hat{R}_t^{Pro}(u_1, s_1, t_1; u_i, s_j, t_m) \neq \hat{R}_t^{Pro}(s_1, t_1; s_j, t_m) \cdot \hat{R}_t^{Pro}(u_1; u_i)$. Thus, the Non-Kronecker structured PFS synthesis method according to embodiments of the present disclosure does not satisfy the second condition of the Kronecker structure. Therefore, the non-Kronecker structure-based PFS synthesis channel reconstruction model according to embodiments of the present disclosure, that is, each ray mapped to a probe antenna is adjusted by the weight matrix, is not Kronecker structured. Compared with the conventional PFS method, the channel reconstruction method provided by embodiments of the present disclosure uses a weight G to weight each ray mapped to a probe instead of directly weighting the probe using a weight w.

Therefore, according to the channel reconstruction method provided by the embodiments of the present disclosure, the dependence of the Rx antenna correlation on the Tx antenna-time correlation may be ensured as much as possible when the optimal weights are applied. That is, the AoA power spectrum of the cluster will be affected by the AoD-Doppler of each ray, which is similar to the GBSC model, and the dependence relationship can be adjusted by the weight matrix G.

The space-time correlation of the reconstructed channel of the Non-Kronecker structured PFS synthesis method according to embodiments of the present disclosure has been discussed. Then, the key to reconstructing the target channel is how to accurately obtain the weight matrix $G \in \mathbb{R}^{K \times Q}$. Different from the existing research which uses spatial correlation as the criterion for emulating the spatial characteristics of the target channel, the channel evaluation criterion is required to be able to evaluate the validity of end-to-end links. Embodiment of the present disclosure provide joint space-time correlation functions corresponding to different channel models, which can evaluate the link validity of the channel. Therefore, an optimization equation may be constructed with the joint space-time correlation of the channel as a measure to determine the weight matrix G, so as to emulate the link characteristics of the reconstructed channel.

The channel reconstruction method provided by the embodiments of the present disclosure can sample the Rx antennas, the Tx antennas and the time using omni-directional antenna pairs. Specifically, a pair of (two) omni-directional antennas are used to sample randomly at the Tx side respectively, i.e., $(s_1; s_j)$, and sample randomly at the Rx side, i.e., $(u_1; u_i)$, sample randomly at different time points, i.e., $(t_1; t_m)$. As such, the channels from different Rx antennas to different Tx antennas at different time points can be expressed, and then $R_t(u_1, s_1, t_1; u_i, s_j, t_m)$ may be obtained.

In an embodiment, the error between the joint space-time correlation $R_t(u_1, s_1, t_1; u_i, s_j, t_m)$ of the channel and the joint space-time correlation $\hat{R}_t^{Pro}(u_1, s_1, t_1; u_i, s_j, t_m)$ of the reconstructed channel may be described by Frobenius norm, and minimizing the Frobenius norm for all Rx antenna pairs, Tx antenna pairs, and sampled time pairs. In order to accurately reconstruct the target channel, the weight matrix G of the channel reconstruction method provided by the embodiments of the present disclosure may be determined by the following objective optimization equation:

$$\min_G \left\| R_t(u_1, s_1, t_1; u_i, s_j, t_m) - \hat{R}_t^{PrO}(u_1, s_1, t_1; u_i, s_j, t_m; G) \right\|_2^2$$

$$\text{s.t. } G \geq 0, G \in R^{K \times Q},$$

$G \geq 0$ indicates that each element of the matrix G is larger than or equal to 0. Obviously, the above equation is a convex problem with linear constraints, which can be easily solved using convex optimization techniques.

In an embodiment, a further condition, $\hat{R}_t^{Pro}(u_1; u_i) = \hat{R}_t^{PFS}(u_1; u_i)$, may be satisfied to ensure that the accuracy of the spatial correlation of the emulated channel in the test area is not affected. A first constraint derived from the further condition may be expressed as $$\frac{1}{Q}\sum_{q=1}^{Q} \alpha_{k,q} = w_k,$$

k=1, 2, ..., K. Therefore, the first constraint is denoted as $G\eta=Qw$, where $\eta=[1, 1, \ldots, 1]^T \in \mathbb{R}^{M \times 1}$.

In another embodiment, a second constraint can be used to accurately synthesize the rays in a cluster to reconstruct the Tx antenna correlation and Doppler characteristics of the target channel in the test area. The second constraint may be defined as $\varepsilon^T G = \eta^T$ from a statistical perspective, where $\varepsilon = [1, 1, \ldots, 1]^T \in \mathbb{R}^{K \times 1}$. Therefore, the sum of elements in each column of the matrix G is 1, that is, $\Sigma_{k=1}^K \alpha_{k,q} = 1$. In addition, there is no need to perform phase calibration when synthesizing the target channel using the non-Kronecker structured PFS method. Thus, the weight $\alpha_{k,q}$ of each ray may be a real number not smaller than zero. As such, the conditions $G \in \mathbb{R}^{K \times Q}$ and $G \geq 0$ may be used as a third constraint in an optimization process.

The error between the joint space-time correlation $R_t(u_1, s_1, t_1; u_i, s_j, t_m)$ of the channel and the joint space-time correlation $\hat{R}_t^{Pro}(u_1, s_1, t_1; u_i, s_j, t_m)$ of the reconstructed channel may be described by Frobenius norm, and minimizing the Frobenius norm for all Rx antenna pairs, Tx antenna pairs, and sampled time pairs. In order to accurately reconstruct the target channel, the weight matrix G of the channel reconstruction method provided by the embodiments of the present disclosure may be determined by the following objective optimization equation:

$$\min_G \left\| R_t(u_1, s_1, t_1; u_i, s_j, t_m) - \hat{R}_t^{Pro}(u_1, s_1, t_1; u_i, s_j, t_m; G) \right\|_2^2$$
$$\text{s.t. } G\eta = Qw, \text{ and/or } \xi^T = \eta^T,$$
$$G \geq 0, G \in R^{K \times Q},$$

$G \geq 0$ indicates that each element of the matrix G is larger than or equal to 0. Obviously, the above equation is a convex problem with linear constraints, which can be easily solved using convex optimization techniques.

Embodiments of the present disclosure provide a Non-Kronecker structured multi-probe PFS channel reconstruction method which is different from the conventional pre-fading synthesis (PFS) method. The channel reconstruction method according to the embodiments of the present disclosure can reconstruct the target space-time channel more accurately in a darkroom environment, for performing more accurate OTA radiation tests on massive multiple-input multiple-output devices. Compared with the conventional PFS method, the Non-Kronecker structured channel reconstruction method according to the embodiments of the present disclosure can reconstruct the target space-time channel environment more accurately, that is, not only can accurately reconstruct the spatial characteristics and Doppler characteristics of the channel, but also can build the dependency between the spatial correlation and the temporal correlation. The constructed multi-probe anechoic chamber system for testing multi-antenna devices may include an anechoic chamber, a sector-shaped probe wall with multiple probe antennas, a fading channel emulator and a user emulator. When evaluating the reconstructed target channel, the Non-Kronecker structured channel reconstruction method according to embodiments of the present disclosure selects the space-time correlation as the criterion for evaluating the reconstructed channel. In addition, the performances of reconstructing the target channel by the Non-Kronecker structured channel reconstruction method according to the embodiments of the present disclosure can be verified according to the channel capacity and diversity characteristics.

Figure 5B:
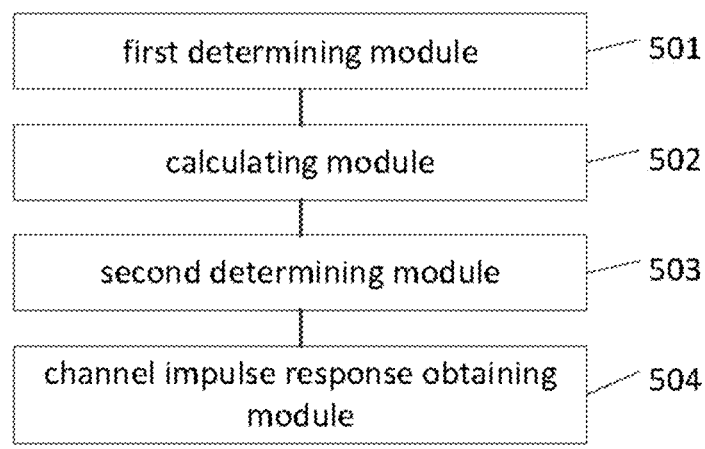
FIG. 5B is a schematic diagram illustrating the structure of a channel reconstructing apparatus according to an embodiment of the present disclosure.

Corresponding to the non-Kronecker structured channel reconstruction method outlined in the above embodiments, embodiments of the present disclosure also provide an apparatus of reconstructing non-Kronecker structured channels. In some embodiments, the apparatus may be the channel emulator as shown in FIG. 2. In some other embodiments, the apparatus may be the computing device as shown in FIG. 5A. As shown in FIG. 5B, the apparatus may include the following components.

A first determining module 501 is for determining a weight matrix. The weight matrix is for emulating link characteristics of the reconstructed channel. The weight matrix includes the weight corresponding to each ray mapped to a probe antenna. In each cluster, the weights of rays mapped to each probe antenna are different from each other.

A calculating module 502 is for calculating, for each cluster, a time-varying fading channel impulse response of each ray of the cluster mapped to a probe antenna based on the weight matrix. The time-varying fading channel impulse response includes a transition equation for each probe antenna describing rays of a cluster mapping to the probe antenna.

A second determining module 503 is for determining a transition matrix from each probe antenna to the Rx antenna of the DUT.

A channel impulse response obtaining module 504 is for using a product of the time-varying fading channel impulse response of the cluster multiplied by the transition matrix as the channel impulse response of the cluster.

In an embodiment, the first determining module 501 may acquire the joint space-time correlation of the target channel; determine the joint space-time correlation of the reconstructed channel; construct a target optimization equation according to the joint space-time correlation of the target channel and the joint space-time correlation of the reconstructed channel; and obtain the weight matrix by solving the target optimization equation using a convex optimization method.

In an embodiment, the first determining module 501 may calculate the joint space-time correlation $\hat{R}_t^{Pro}(u_1, s_1, t_1; u_i, s_j, t_m)$ of the reconstructed channel using the channel impulse response of each cluster at different time points through the formula: $\hat{R}_t^{Pro}(u_1, s_1, t_1; u_i, s_j, t_m) = \{\hat{R}_t^{Pro}(u_1, s_1, t_1; u_i, s_j, t_m)\} \in \mathbb{C}^{U \times S \times M}$.

where, $$\hat{R}_t^{Pro}(u_1, s_1, t_1; u_i, s_j, t_m) = \frac{1}{Q} \sum_{k=1}^K F_{u_1,u_j,k}^{Pro} \sum_{q=1}^Q \alpha_{k,q} \cdot F_{s_1,s_j,q}^{Pro} \cdot \Phi_{t_1,t_j,q}^{Pro}$$

$$F_{u_1,u_i,k}^{Pro} \triangleq F_{u_1}^V(\Omega_k) \cdot F_{u_1}^V(\Omega_k)^* \cdot \exp\left(j\frac{2\pi}{\lambda} r_k^{rx} \cdot d_{u_1}^{rx}\right) \cdot \exp\left(j\frac{2\pi}{\lambda} r_k^{rx} \cdot d_{u_i}^{rx}\right)^*$$

$$F_{s_1,s_j,q}^{Pro} \triangleq F_{s_1}^V(\Omega_{n,q}^{AoD}) \cdot F_{s_j}^V(\Omega_{n,q}^{AoD})^* \cdot \exp\left(j\frac{2\pi}{\lambda} r_{n,q}^{tx} \cdot d_{s_1}^{tx}\right) \cdot \exp\left(j\frac{2\pi}{\lambda} r_{n,q}^{tx} \cdot d_{s_j}^{tx}\right)^*$$

$$\Phi_{t_1,t_m,q}^{Pro} \triangleq \exp(j2\pi \vartheta_{n,q} t_1) \cdot \exp(j2\pi \vartheta_{n,q} t_m)^*,$$

where, $F_{u_1 u_i, k}^{Pro}$ denotes the correlation between Rx antennas relative to the k-th probe antenna, $F_{u_1}^V$ denotes the vertically polarized antenna pattern of the $u_1$-th receiving antenna of the DUT, $F_{u_i}^V$ denotes the vertically polarized antenna pattern of the $u_i$-th receiving antenna of the DUT, $\Omega_k$ denotes the spatial angle of the k-th probe antenna, $r_k^{rx}$ denotes the spherical unit vector of the k-th probe antenna, $d_{u_1}^{rx}$ denotes the position vector of the $u_1$-th Rx antenna relative to the center of the base station, $F_{s_1,s_j,q}^{Pro}$ denotes the correlation between Tx antennas relative to the q-th ray, $F_{s_1}^V$ denotes the vertically polarized antenna pattern of the $s_1$-th Tx antenna of the user terminal, $\Omega_{n,q}^{AoD}$ denotes the AoD of the q-th ray of the n-th cluster, $F_{s_1}^V$ denotes the vertically polarized antenna pattern of the $s_j$-th Tx antenna of the user terminal, $r_{n,q}^{tx}$ denotes the spherical unit vector of the Tx antenna to $\Omega_{n,q}^{AoD}$, $d_{s_j}^{rx}$ denotes the position vector of the $s_j$-th Tx antenna relative to the center of the user terminal, $\Phi_{t_1,t_m,q}^{Pro}$ denotes the correlation function of the q-th ray of the n-th cluster at time point $t_1$ and time point $t_m$, $\varepsilon_{n,q}$ denotes the Doppler frequency of the q-th ray of the n-th cluster, $\mathbb{C}$ denotes a complex number, $\mathbb{C}^{U \times S \times M}$ denotes the elements of the matrix $\hat{R}_t^{Pro}(u_1, s_1, t_1; u_i, s_j, t_m)$ are complex numbers, and the dimension of the matrix is $U \times S \times M$.

In an embodiment, the first determining module 501 may construct a target optimization equation according to the joint space-time correlation of the target channel and the joint space-time correlation of the reconstructed channel as $$\min_G \left\| R_t(u_1, s_1, t_1; u_i, s_j, t_m) - \hat{R}_t^{PrO}(u_1, s_1, t_1; u_i, s_j, t_m; G) \right\|_2^2,$$

where, $R_t(u_1, s_1, t_1; u_i, s_j, t_m)$ denotes the joint space-time correlation of the target channel, $\hat{R}_t^{Pro}(u_1, s_1, t_1; u_i, s_j, t_m; G)$ denotes the joint space-time correlation of the reconstructed channel, and G is the weight matrix.

In an embodiment, the calculating module 502 may calculate, for each probe antenna, the transition equation of rays in the cluster mapped to the probe antenna using a formula $h_{k,s,n}^{Pro}(t, \tau) = \Sigma_{q=1}^{Q} \sqrt{\alpha_{k,q}} \cdot h_{k,s,n,q}^{Pro}(t, \tau)$, where, $\alpha_{k,q}$ denotes the weight of the q-th ray mapped to the k-th probe antenna, $\mathbb{R}$ denotes real number, $\alpha_{k,q} \in \mathbb{R}$ indicates $\alpha_{k,q}$ is a real number, Q denotes the total number of rays in the n-th cluster, $h_{k,s,n}^{Pro}(t, \tau)$ is the transition equation from the s-th Tx antenna to the k-th probe antenna on the q-th ray of the n-th cluster;

$$h_{k,s,n,q}^{PrO}(t, \tau) = \sqrt{\frac{P_n}{Q}} \cdot F_S^V(\Omega_{n,q}^{AoD}) \cdot F_k \cdot \exp\left(j\frac{2\pi}{\lambda} r_{n,q}^{rx} \cdot d_s^{tx}\right) \cdot \exp(j\pi v_{n,q} t + j\alpha_{n,q,k}) \cdot \delta(\tau - \tau_n)$$

where, t denotes the time, $\tau$ denotes the time delay, $P_n$ denotes the power of the n-th cluster, $F_s^V$ denotes the vertically polarized antenna pattern of the s-th Tx antenna of the user terminal, $\Omega_{n,q}^{AoD}$ denotes the AoD of the q-th ray of the n-th cluster, and $F_k$ denotes the ideal polarized antenna pattern of the k-th probe, $\lambda$ denotes the wavelength, $r_{n,q}^{tx}$ denotes the spherical unit vector from a Tx antenna to $\Omega_{n,q}^{AoD}$, $d_{s_s}^{tx}$ denotes the position vector of the s-th Tx antenna relative to the center of the user terminal, $v_{n,q}$ denotes the Doppler frequency of the q-th ray of the n-th cluster, $\alpha_{n,q,k}$ denotes the random phase of the q-th ray of the n-th cluster mapped to the k-th probe, $\delta(\tau-\tau_n)$ denotes a pulse function, and $\tau_n$ denotes the delay of the n-th cluster.

In an embodiment, the second determining module 503 may calculate the transition matrix from each probe antenna to the Rx antennas of the DUT through a formula $$v = \left\{ F_u^V(\Omega_k) \cdot \exp\left(j\frac{2\pi}{\lambda} r_k^{rx} \cdot d_u^{tx}\right) \right\} \in \mathbb{C}^{1 \times K};$$

where, v denotes the transition matrix from the K probe antennas to the u-th antenna of the DUT, $\mathbb{C}^{1 \times K}$ denotes the elements of v are complex numbers, and the dimension of v is 1×K, $F_u^V$ denotes the vertically polarized antenna pattern of the u-th Rx antenna of the DUT, $\Omega_k$ denotes the spatial angle of the k-th probe antenna, $r_k^{rx}$ denotes the spherical unit vector of the k-th probe antenna, and $d_u^{rx}$ denotes the position vector of the u-th Rx antenna relative to the center of the base station.

In an embodiment, the channel impulse response obtaining module 504 may calculate the channel impulse response of the cluster using a formula $h_{u,s,n}^{Pro}(t, \tau) = v h_{K,s,n}^{Pro}(t, \tau)$; where, $h_{u,s,n}^{Pro}(t, \tau)$ denotes the channel impulse response of the n-th cluster.

Figure 6:
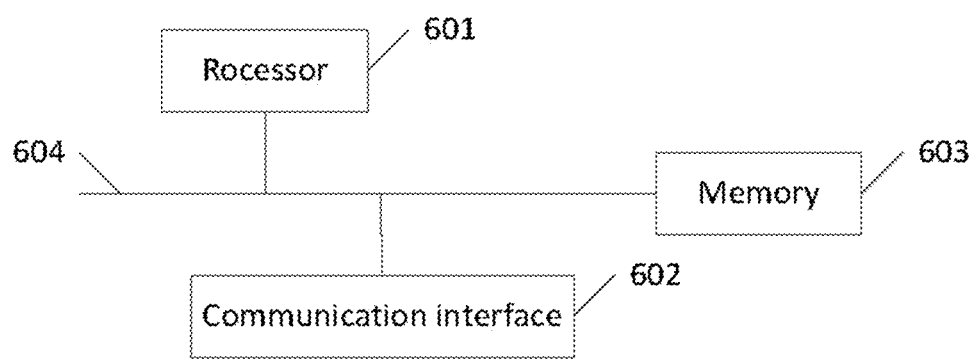
FIG. 6 is a schematic diagram illustrating the structure of a device of reconstructing non-Kronecker structured channels according to an embodiment of the present disclosure.

Various embodiments of the present disclosure also provide a device of reconstructing non-Kronecker structured channels. As shown in FIG. 6, the device may include a processor 601, a communication interface 602, a memory 603, and a communication bus 604. The processor 601 communication interface 602 and the memory 603 communicate with each other through the communication bus 604.

The memory 603 is for storing computer programs;
the processor 601 is for implementing the method steps of the foregoing channel reconstruction method when executing the programs stored in the memory 603.

The communication bus of the above-mentioned non-Kronecker structured channel reconstruction device may be a peripheral component interconnect (PCI) bus or an extended industry standard architecture (EISA) bus. The communication bus may be include an address bus, a data bus, a control bus, or the like. For illustration, the communication bus is denoted by merely one thick line in the drawing, but it does not necessarily mean that there is only one bus or one type of bus.

The communication interface is for enabling communication between the above-mentioned non-Kronecker structured channel reconstruction device and other devices.

The memory may include random access memory (RAM), or may also include non-volatile memory (NVM), such as at least one magnetic disk storage. In an embodiment, the memory may also include at least one storage device located far away from a physical device where the processor is located.

The above-mentioned processor may be a general-purpose processor, including a central processing unit (CPU), a network processor (NP), or the like. The processor may also include a digital signal processor (DSP), dedicated integrated circuits (e.g., an application specific integrated circuit, ASIC), a field-programmable gate array (FPGA), or other programmable logic devices, discrete gates or transistor logic devices, discrete hardware components.

Another embodiment of the present disclosure provide a non-transitory computer-readable storage medium. The computer-readable storage medium stores a computer program executable by the processor to carry out the method steps of the Kronecker structured channel reconstruction method.

Another embodiment of the present disclosure provides a computer program product including instructions executable by a computer to implement the method steps of the non-Kronecker structured channel reconstruction method outlined in the above embodiments.

The above-mentioned embodiments may be implemented in whole or in part by software, hardware, firmware, or any combination thereof. When implemented by software, it may be implemented in the form of a computer program product in whole or in part. The computer program product may include one or multiple computer instructions. When the computer program instructions are loaded and executed by a computer, the processes or functions described in the embodiments of the present disclosure are generated in whole or in part. The computer may be a general-purpose computer, a special-purpose computer, a computer network, or other programmable devices. The computer instructions may be stored in a computer-readable storage medium, or transmitted from one computer-readable storage medium to another computer-readable storage medium. For example, the computer instructions may be transmitted from a website, computer, a server, or a data center to another website, computer, server or data center via wired manners (such as coaxial cable, optical fiber, digital subscriber line (DSL)) or wireless manners (such as infrared, radio, microwave, etc.). The computer-readable storage medium may be any available medium that may be accessed by a computer or a data storage device such as a server or data center integrated with one or multiple available media. The available medium may be a magnetic medium (for example, a floppy disk, a hard disk, a magnetic tape), an optical medium (for example, a DVD), or a semiconductor medium (for example, a solid state disk (SSD)).

It should be noted that in this article, relational terms such as "first" and "second" are merely for distinguishing one entity or operation from another, and do not necessarily require or imply there is any such actual relationship or order between these entities or operations. Moreover, the terms "include", "composed of" or any other variants thereof are intended to cover non-exclusive inclusion, so that a process, method, article or device including a series of elements not only includes those elements, but also may include other elements that are not explicitly listed, or may also include elements inherent to this process, method, article or equipment. If there are no extra limitations, the element defined by the sentence "including a . . . " does not exclude the existence of other same or similar elements in the process, method, article, or equipment that includes the element.

The various embodiments in this specification are described in a related manner, and the same or similar parts between the various embodiments may be referred to each other, and each embodiment focuses on the differences from other embodiments. In particular, for the device, equipment, computer-readable storage medium, and computer program product embodiment, since they are basically similar to the method embodiment, the description is relatively simple, and the relevant parts may be referred to the part of the description of the method embodiment.

The foregoing descriptions are only preferred embodiments of the present disclosure, and are not used to limit the protection scope of the present disclosure. Any modification, equivalent replacement, improvement, etc. made within the spirit and principle of the present disclosure are all included in the protection scope of the present disclosure.

What is claimed is:

1. A method of reconstructing non-Kronecker structured channels, carried out by a channel emulator which is connected to a communication counterpart of a device under test (DUT) and probe antennas of a testing system, the method comprising:

generating an output for each of the probe antennas of the testing system by processing signals from the communication counterpart of the DUT using a channel impulse response which is determined by:

determining a weight matrix, the weight matrix is for emulating link characteristics of a reconstructed channel, the weight matrix includes a weight corresponding to each ray mapped to a probe antenna of the probe antennas; in each cluster, rays mapped to each of the probe antenna have different weights with each other;

calculating, for each cluster, a time-varying fading channel impulse response of each ray of the each cluster mapped to a probe antenna of the probe antennas based on the weight matrix; the time-varying fading channel impulse response includes a transition equation for each probe antenna describing mapping of rays of the each cluster to the each probe antenna;

determining a transition matrix from each of the probe antennas to receiving antennas of the DUT; and using a product of the time-varying fading channel impulse response of each cluster multiplied by the transition matrix as a channel impulse response of the each cluster.

2. The method according to claim 1, wherein determining the weight matrix comprises:

acquiring a joint space-time correlation of a target channel;

determining a joint space-time correlation of the reconstructed channel;

constructing a target optimization equation using the joint space-time correlation of the target channel and the joint space-time correlation of the reconstructed channel; and obtaining the weight matrix by solving the target optimization equation using a convex optimization method.

3. The method according to claim 2, wherein determining the joint space-time correlation of the reconstructed channel comprises:

calculating the joint space-time correlation $\hat{R}_t^{Pro}$ ($u_1$, $s_1$, $t_1$; $u_i$, $s_j$, $t_m$) of the reconstructed channel using a channel impulse response of each cluster at different time points using $\hat{R}_t^{Pro}(u_1, s_1, t_1; u_i, s_j, t_m) = \{\hat{R}_t^{Pro}(u_1, s_1, t_1; u_i, s_j, t_m)\} \in \mathbb{C}^{U \times S \times M}$;

$$\hat{R}_t^{PrO}(u_1, s_1, t_1; u_i, s_j, t_m) = \frac{1}{Q} \sum_{k=1}^{K} F_{u_1,u_j,k}^{Pro} \sum_{q=1}^{Q} \alpha_{k,q} \cdot F_{s_1,s_j,q}^{PrO} \cdot \Phi_{t_1,t_j,q}^{PrO}$$

$$F_{u_1,u_i,k}^{PrO} \triangleq F_{u_1}^{V}(\Omega_k) \cdot F_{u_i}^{V}(\Omega_k)^* \cdot \exp\left(j\frac{2\pi}{\lambda} r_k^{rx} \cdot d_{u_1}^{rx}\right) \cdot \exp\left(j\frac{2\pi}{\lambda} r_k^{rx} \cdot d_{u_i}^{rx}\right)^*$$

$$F_{s_1,s_j,k}^{PrO} \triangleq F_{s_1}^{V}(\Omega_{n,q}^{AoD}) \cdot F_{s_j}^{V}(\Omega_{n,q}^{AoD})^* \cdot \exp\left(j\frac{2\pi}{\lambda} r_{n,q}^{rx} \cdot d_{s_1}^{rx}\right) \cdot \exp\left(j\frac{2\pi}{\lambda} r_{n,q}^{rx} \cdot d_{s_j}^{rx}\right)^*$$

$$\Phi_{t_1,t_m,q}^{PrO} \triangleq \exp(j2\pi\vartheta_{n,q}t_1) \cdot \exp(j2\pi\vartheta_{n,q}t_m)^*,$$

where, $F_{u_1,u_j,k}^{Pro}$ denotes a correlation between receiving antennas relative to a k-th probe antenna of the probe antennas, $F_{u_1}^{V}$ denotes a vertically polarized antenna pattern of a $u_1$-th receiving antenna of the DUT, $F_{u_i}^{V}$ denotes a vertically polarized antenna pattern of a $u_i$-th receiving antenna of the DUT, $\Omega_k$ denotes a spatial angle of the k-th probe antenna, $r_k^{rx}$ denotes a spherical unit vector of the k-th probe antenna, $d_{u_1}^{rx}$ denotes a position vector of the $u_1$-th receiving antenna relative to a center of a base station, $F_{s_1,s_j,q}^{Pro}$ denotes a correlation between transmitting antennas of a user terminal relative to the q-th ray, $F_{s_1}^{V}$ denotes a vertically polarized antenna pattern of a $s_1$-th transmitting antenna of the user terminal, $\Omega_{n,q}^{AoD}$ denotes an angle of departure (AoD) of a q-th ray of a n-th cluster, $F_{s_j}^V$ denotes a vertically polarized antenna pattern of a $s_j$-th transmitting antenna of the user terminal, $r_{n,q}^{tx}$ denotes a spherical unit vector of the transmitting antennas to $\Omega_{n,q}^{AoD}$, $d_{s_j}^{tx}$ denotes a position vector of the $s_j$-th transmitting antenna relative to a center of the user terminal, $\Phi_{t_1,t_m,q}^{Pro}$ denotes a correlation function of the q-th ray of the n-th cluster at time point $t_1$ and time point $t_m$, $\vartheta_{n,q}$ denotes a Doppler frequency of the q-th ray of the n-th cluster, $\mathbb{C}$ denotes a complex number, and $\mathbb{C}^{U \times S \times M}$ indicates elements of matrix $\hat{R}_t^{Pro}(u_1, s_1, t_1; u_i, s_j, t_m)$ are complex numbers, and dimension of the matrix is U×S×M.

4. The method according to claim 3, wherein constructing the target optimization equation using the joint space-time correlation of the target channel and the joint space-time correlation of the reconstructed channel comprises:
constructing the target optimization equation according to the joint space-time correlation of the target channel and the joint space-time correlation of the reconstructed channel as $$\min_G \left\| R_t(u_1, s_1, t_1'u_i, s_j, t_m) - \hat{R}_t^{PrO}(u_1, s_1, t_1; u_i, s_j, t_m; G) \right\|_2^2;$$

where, $R_t(u_1, s_1, t_1; u_i, s_j, t_m)$ denotes the joint space-time correlation of the target channel, $\hat{R}_t^{Pro}(u_1, s_i, t_1; u_i, s_j, t_m; G)$ denotes the joint space-time correlation of the reconstructed channel, and G is the weight matrix.

5. The method according to claim 1, wherein calculating, for each cluster, the time-varying fading channel impulse response of each ray of the each cluster mapped to the probe antenna of the probe antennas based on the weight matrix comprises:
calculating, for each probe antenna of the probe antennas, a transition equation of rays in the each cluster mapped to each probe antenna using $h_{k,s,n}^{Pro}(t, \tau) = \Sigma_{q=1}^Q \sqrt{\alpha_{k,q}} \cdot h_{k,s,n,q}^{Pro}(t, \tau)$;
where, $\alpha_{k,q}$ denotes a weight of a q-th ray mapped to a k-th probe antenna of the probe antennas, $\mathbb{C}$ denotes a real number, $\alpha_{k,q} \in \mathbb{C}$ indicates $\alpha_{k,q}$ is a real number, Q denotes a total number of rays in a n-th cluster, $h_{k,s,n}^{Pro}(t, \tau)$ is a transition equation from a s-th transmitting antenna of a user terminal to the k-th probe antenna on the q-th ray of the n-th cluster;

$$h_{k,s,n,q}^{PrO}(t, \tau) = \sqrt{\frac{P_n}{Q}} \cdot F_S^V(\Omega_{n,q}^{AoD}) \cdot F_k \cdot \exp\left(j\frac{2\pi}{\lambda} r_{n,q}^{tx} \cdot d_s^{tx}\right) \cdot \exp(j\pi v_{n,q} t + j\alpha_{n,q,k}) \cdot \delta(\tau - \tau_n)$$

where, t denotes time, $\tau$ denotes a time delay, $P_n$ denotes power of the n-th cluster, $F_s^V$ denotes a vertically polarized antenna pattern of the s-th transmitting antenna of B the user terminal, $\Omega_{n,q}^{AoD}$ denotes an AoD of a q-th ray of the n-th cluster, $F_k$ denotes an ideal polarized antenna pattern of the k-th probe antenna, $\lambda$ denotes a wavelength, $r_{n,q}^{tx}$ denotes a spherical unit vector from transmitting antennas of the user terminal to $\Omega_{n,q}^{AoD}$, $d_{s_j}^{tx}$ denotes a position vector of the s-th transmitting antenna relative to a center of the user terminal, $v_{n,q}$ denotes a Doppler frequency of the q-th ray of the n-th cluster, $\alpha_{n,q,k}$ denotes a random phase of the q-th ray of the n-th cluster mapped to the k-th probe antenna, $\delta(\tau-\tau_n)$ denotes a pulse function, and $\tau_n$ denotes a delay of the n-th cluster.

6. The method according to claim 5, wherein determining the transition matrix of each of the probe antennas to the receiving antennas of the DUT comprises:
calculating the transition matrix from each probe antenna to the receiving antennas of the DUT using $$v = \left\{ F_u^V(\Omega_k) \cdot \exp\left(j\frac{2\pi}{\lambda} r_k^{rx} \cdot d_u^{rx}\right) \right\} \in \mathbb{C}^{1 \times K};$$

where, v denotes a transition matrix from K probe antennas to a u-th receiving antenna of the DUT, $\mathbb{C}^{1 \times K}$ denotes elements of v are complex numbers, and dimension of v is 1×K, $F_u^V$ denotes a vertically polarized antenna pattern of a u-th receiving antenna of the DUT, $\Omega_k$ denotes a spatial angle of the k-th probe antenna, $r_k^{rx}$ denotes a spherical unit vector of the k-th probe antenna, and $d_u^{rx}$ denotes a position vector of the u-th receiving antenna relative to a center of a base station.

7. The method according to claim 6, wherein using the product of the time-varying fading channel impulse response of each cluster multiplied by the transition matrix as the channel impulse response of the each cluster comprises:
calculating the channel impulse response of the each cluster using $h_{u,s,n}^{Pro}(t, \tau) = v h_{k,s,n}^{Pro}(t, \tau)$;
where, $h_{u,s,n}^{Pro}(t, \tau)$ denotes the channel impulse response of the n-th cluster.

8. A testing system of reconstructing non-Kronecker structured channels, comprising: a channel emulator which is connected to a communication counterpart of a device under test (DUT) and probe antennas of the testing system; and a computing device;
wherein the computing device is for:
determining a weight matrix, the weight matrix is for emulating link characteristics of a reconstructed channel, the weight matrix includes a weight corresponding to each ray mapped to a probe antenna of the probe antennas of the testing system; in each cluster, rays mapped to each of the probe antennas have different weights from each other;
calculating, for each cluster, a time-varying fading channel impulse response of each ray of the each cluster mapped to a probe antenna of the probe antennas based on the weight matrix, the time-varying fading channel impulse response includes a transition equation for each probe antenna describing mapping rays of the each cluster to the each probe antenna;
determining a transition matrix from each of the probe antennas to receiving antennas of the DUT; and
using a product of the time-varying fading channel impulse response of each cluster multiplied by the transition matrix as a channel impulse response of the each cluster; and
wherein the channel emulator is for:
generating an output for each of the probe antennas of the testing system by processing signals from the communication counterpart of the DUT using the channel impulse response generated by the computing device.

9. The testing system according to claim 8, wherein the computing device is further for:
acquiring a joint space-time correlation of a target channel;

27 determining a joint space-time correlation of the reconstructed channel;
constructing a target optimization equation using the joint space-time correlation of the target channel and the joint space-time correlation of the reconstructed channel; and
obtaining the weight matrix by solving the target optimization equation using a convex optimization method.

10. The testing system according to claim 9, wherein the computing device is further for:
calculating the joint space-time correlation $\hat{R}_t^{Pro}(u_1, s_1, t_1; u_i, s_j, t_m)$ of the reconstructed channel using a channel impulse response of each cluster at different time points using $\hat{R}_t^{Pro}(u_1, s_1, t_1; u_i, s_j, t_m) = \{\hat{R}_t^{Pro}(u_1, s_1, t_1; u_i, s_j, t_m)\} \in \mathbb{C}^{U \times S \times M}$;
where $$\hat{R}_t^{PrO}(u_1, s_1, t_1; u_i, s_j, t_m) = \frac{1}{Q} \sum_{k=1}^{K} F_{u_1,u_j,k}^{Pro} \sum_{q=1}^{Q} \alpha_{k,q} \cdot F_{s_1,s_j,q}^{PrO} \cdot \Phi_{t_1,t_j,q}^{PrO}$$

$$F_{u_1,u_j,k}^{PrO} \triangleq F_{u_1}^V(\Omega_k) \cdot F_{u_i}^V(\Omega_k)^* \cdot \exp\left(j\frac{2\pi}{\lambda}r_k^{rx} \cdot d_{u_1}^{rx}\right) \cdot \exp\left(j\frac{2\pi}{\lambda}r_k^{rx} \cdot d_{u_i}^{rx}\right)^*$$

$$F_{s_1,s_j,q}^{PrO} \triangleq F_{s_1}^V(\Omega_{n,q}^{AoD}) \cdot F_{s_j}^V(\Omega_{n,q}^{AoD})^* \cdot \exp\left(j\frac{2\pi}{\lambda}r_{n,q}^{tx} \cdot d_{s_1}^{tx}\right) \cdot \exp\left(j\frac{2\pi}{\lambda}r_{n,q}^{tx} \cdot d_{s_j}^{tx}\right)^*$$

$$\Phi_{t_1,t_m,q}^{PrO} \triangleq \exp(j2\pi\vartheta_{n,q}t_1) \cdot \exp(j2\pi\vartheta_{n,q}t_m)^*,$$

where, $F_{u_1,u_j,k}^{Pro}$ denotes a correlation between receiving antennas relative to a k-th probe antenna of the probe antennas, $F_{u_1}^V$ denotes a vertically polarized antenna pattern of a $u_1$-th receiving antenna of the DUT, $F_{u_i}^V$ denotes a vertically polarized antenna pattern of a $u_i$-th receiving antenna of the DUT, $\Omega_k$ denotes a spatial angle of the k-th probe antenna, $r_k^{rx}$ denotes a spherical unit vector of the k-th probe antenna, $d_{u_1}^{rx}$ denotes a position vector of the $u_1$-th receiving antenna relative to a center of a base station, $F_{s_1,s_j,q}^{Pro}$ denotes a correlation between transmitting antennas of a user terminal relative to the q-th ray, $F_{s_1}^V$ denotes a vertically polarized antenna pattern of a $s_1$-th transmitting antenna of the user terminal, $\Omega_{n,q}^{AoD}$ denotes an angle of departure (AoD) of a q-th ray of a n-th cluster, $F_{s_j}^V$ denotes a vertically polarized antenna pattern of a $s_j$-th transmitting antenna of the user terminal, $r_{n,q}^{tx}$ denotes a spherical unit vector of the transmitting antennas to $\Omega_{n,q}^{AoD}$, $d_{s_j}^{tx}$ denotes a position vector of the $s_j$-th transmitting antenna relative to a center of the user terminal, $\Phi_{t_1,t_m,q}^{Pro}$ denotes a correlation function of the q-th ray of the n-th cluster at time point $t_1$ and time point $t_m$, $\varepsilon_{n,q}$ denotes a Doppler frequency of the q-th ray of the n-th cluster, $\mathbb{C}$ denotes a complex number, and $\mathbb{C}^{U \times S \times M}$ indicates elements of matrix $\hat{R}_t^{Pro}(u_1, s_1, t_1; u_i, s_j, t_m)$ are complex numbers, and dimension of the matrix is U×S×M.

11. The testing system according to claim 10, wherein the computing device is further for:
constructing the target optimization equation according to the joint space-time correlation of the target channel and the joint space-time correlation of the reconstructed channel as $$\min_{G} \left\| R_t(u_1, s_1, t_1; u_i, s_j, t_m) - \hat{R}_t^{PrO}(u_1, s_1, t_1; u_i, s_j, t_m; G) \right\|_2^2;$$

28 where, $R_t(u_1, s_1, t_1; u_i, s_j, t_m)$ denotes the joint space-time correlation of the target channel, $\hat{R}_t^{Pro}(u_1, s_1, t_1; u_i, s_j, t_m; G)$ denotes the joint space-time correlation of the reconstructed channel, and G is the weight matrix.

12. The testing system according to claim 8, wherein the computing device is further for:
calculating, for each probe antenna of the probe antennas, a transition equation of rays in each cluster mapped to each probe antenna using $h_{k,s,n}^{Pro}(t, \tau) = \sum_{q=1}^{Q} \sqrt{\alpha_{k,q}} \cdot h_{k,s,n,q}^{Pro}(t, \tau)$;
where, $\alpha_{k,q}$ denotes a weight of a q-th ray mapped to a k-th probe antenna of the probe antennas, R denotes a real number, $\alpha_{k,q} \in \mathbb{R}$ indicates $\alpha_{k,q}$ is a real number, Q denotes a total number of rays in a n-th cluster, $h_{k,s,n}^{Pro}(t, \tau)$ is a transition equation from a s-th transmitting antenna of a user terminal to the k-th probe antenna on the q-th ray of the n-th cluster;

$$h_{k,s,n,q}^{PrO}(t, \tau) = \sqrt{\frac{P_n}{Q}} \cdot F_S^V(\Omega_{n,q}^{AoD}) \cdot F_k \cdot \exp\left(j\frac{2\pi}{\lambda}r_{n,q}^{tx} \cdot d_s^{tx}\right) \cdot \exp(j\pi v_{n,q}t + j\alpha_{n,q,k}) \cdot \delta(\tau - \tau_n)$$

where, t denotes time, $\tau$ denotes a time delay, $P_n$ denotes power of the n-th cluster, $F_s^V$ denotes a vertically polarized antenna pattern of the s-th transmitting antenna of the user terminal, $\Omega_{n,q}^{AoD}$ denotes an AoD of a q-th ray of the n-th cluster, $F_k$ denotes an ideal polarized antenna pattern of the k-th probe antenna, $\lambda$ denotes a wavelength, $r_{n,q}^{tx}$ denotes a spherical unit vector from transmitting antennas of the user terminal to $\Omega_{n,q}^{AoD}$, $d_s^{tx}$ denotes a position vector of the s-th transmitting antenna relative to a center of the user terminal, $v_{n,q}$ denotes a Doppler frequency of the q-th ray of the n-th cluster, $\alpha_{n,q,k}$ denotes a random phase of the q-th ray of the n-th cluster mapped to the k-th probe antenna, $\delta(\tau-\tau_n)$ denotes a pulse function, and $\tau_n$ denotes a delay of the n-th cluster.

13. The testing system according to claim 12, wherein the computing device is further for:
calculating the transition matrix from each probe antenna to the receiving antennas of the DUT using $$v = \left\{ F_u^V(\Omega_k) \cdot \exp\left(j\frac{2\pi}{\lambda}r_k^{rx} \cdot d_u^{rx}\right) \right\} \in \mathbb{C}^{1 \times K};$$

where, v denotes a transition matrix from K probe antennas to a u-th receiving antenna of the DUT, $\mathbb{C}^{1 \times K}$ denotes elements of v are complex numbers, and dimension of v is 1×K, $F_u^V$ denotes a vertically polarized antenna pattern of a u-th receiving antenna of the DUT, $\Omega_k$ denotes a spatial angle of the k-th probe antenna, $r_k^{rx}$ denotes a spherical unit vector of the k-th probe antenna, and $d_u^{rx}$ denotes a position vector of the u-th receiving antenna relative to a center of a base station.

14. The testing system according to claim 13, wherein the computing device is further for:
calculating the channel impulse response of each cluster using $h_{u,s,n}^{Pro}(t, \tau) = v h_{k,s,n}^{Pro}(t, \tau)$;
where, $h_{u,s,n}^{Pro}(t, \tau)$ denotes the channel impulse response of the n-th cluster.

15. A device of reconstructing non-Kronecker structures channels, comprising a processor, a communication interface, a memory, and a communication bus; the device is connected to a communication counterpart of a device under test (DUT) and probe antennas of a testing system,
  wherein the processor, the communication interface, and the memory communicate with each other through the communication bus;
  the memory stores computer programs; and
  the processor executes the computer programs to perform actions of:
    determining a weight matrix, the weight matrix is for emulating link characteristics of a reconstructed channel, the weight matrix includes a weight corresponding to each ray mapped to a probe antenna of the probe antennas of the testing system; in each cluster, rays mapped to each of the probe antennas have different weights with each other;
    calculating, for each cluster, a time-varying fading channel impulse response of each ray of the each cluster mapped to a probe antenna of the probe antennas based on the weight matrix; the time-varying fading channel impulse response includes a transition equation for each probe antenna describing mapping of rays of the each cluster to the each probe antenna;
    determining a transition matrix from each of the probe antennas to receiving antennas of the DUT;
    using a product of the time-varying fading channel impulse response of each cluster multiplied by the transition matrix as a channel impulse response of the each cluster; and
    generating an output for each of the probe antennas of the testing system by processing signals from the communication counterpart of the DUT using the channel impulse response.

16. The device according to claim 15, wherein the processor executes the computer programs to perform further actions of:
  acquiring a joint space-time correlation of a target channel;
  determining a joint space-time correlation of the reconstructed channel;
  constructing a target optimization equation using the joint space-time correlation of the target channel and the joint space-time correlation of the reconstructed channel; and
  obtaining the weight matrix by solving the target optimization equation using a convex optimization method.

17. The device according to claim 16, wherein the processor executes the computer programs to perform further actions of:
  calculating the joint space-time correlation $\hat{R}_t^{Pro}(u_1, s_1, t_1; u_i, s_j, t_m)$ of the reconstructed channel using a channel impulse response of each cluster at different time points using $\hat{R}_t^{Pro}(u_1, s_1, t_1; u_i, s_j, t_m) = \{\hat{R}_t^{Pro}(u_1, s_1, t_1; u_i, s_j, t_m)\} \in \mathbb{C}^{U \times S \times M}$;
where, $$\hat{R}_t^{PrO}(u_1, s_1, t_1; u_i, s_j, t_m) = \frac{1}{Q}\sum_{k=1}^{K} F_{u_1,u_j,k}^{Pro} \sum_{q=1}^{Q} \alpha_{k,q} \cdot F_{s_1,s_j,q}^{PrO} \cdot \Phi_{t_1,t_j,q}^{PrO}$$

$$F_{u_1,u_i,k}^{PrO} \triangleq F_{u_1}^V(\Omega_k) \cdot F_{u_i}^V(\Omega_k)^* \cdot \exp\left(j\frac{2\pi}{\lambda}r_k^{rx} \cdot d_{u_1}^{rx}\right) \cdot \exp\left(j\frac{2\pi}{\lambda}r_k^{rx} \cdot d_{u_i}^{rx}\right)^*$$

$$F_{s_1,s_j,k}^{PrO} \triangleq F_{s_1}^V(\Omega_{n,q}^{AoD}) \cdot F_{s_j}^V(\Omega_{n,q}^{AoD})^* \cdot \exp\left(j\frac{2\pi}{\lambda}r_{n,q}^{tx} \cdot d_{s_1}^{tx}\right) \cdot \exp\left(j\frac{2\pi}{\lambda}r_{n,q}^{tx} \cdot d_{s_j}^{tx}\right)^*$$

$$\Phi_{t_1,t_m,q}^{PrO} \triangleq \exp(j2\pi\vartheta_{n,q}t_1) \cdot \exp(j2\pi\vartheta_{n,q}t_m)^*,$$

where, $F_{u_1,u_i,k}^{Pro}$ denotes a correlation between receiving antennas relative to a k-th probe antenna of the probe antennas, $F_{u_1}^V$ denotes a vertically polarized antenna pattern of a $u_1$-th receiving antenna of the DUT, $F_{u_i}^V$ denotes a vertically polarized antenna pattern of a $u_i$-th receiving antenna of the DUT, $\Omega_k$ denotes a spatial angle of the k-th probe antenna, $r_k^{rx}$ denotes a spherical unit vector of the k-th probe antenna, $d_{u_1}^{rx}$ denotes a position vector of the $u_1$-th receiving antenna relative to a center of a base station, $F_{s_1,s_j,q}^{Pro}$ denotes a correlation between transmitting antennas of a user terminal relative to the q-th ray, $F_{s_1}^V$ denotes a vertically polarized antenna pattern of a $s_1$-th transmitting antenna of the user terminal, $\Omega_{n,q}^{AoD}$ denotes an angle of departure (AoD) of a q-th ray of a n-th cluster, $F_{s_j}^V$ denotes a vertically polarized antenna pattern of a $s_j$-th transmitting antenna of the user terminal, $r_{n,q}^{tx}$ denotes ae spherical unit vector of the transmitting antennas to $\Omega_{n,q}^{AoD}$, $d_{s_j}^{rx}$ denotes a position vector of the $s_j$-th transmitting antenna relative to a center of the user terminal, $\Phi_{t_1,t_m,q}^{Pro}$ denotes a correlation function of the q-th ray of the n-th cluster at time point $t_1$ and time point $t_m$, $\vartheta_{n,q}$ denotes a Doppler frequency of the q-th ray of the n-th cluster, $\mathbb{C}$ denotes a complex number, and $\mathbb{C}^{U \times S \times M}$ indicates elements of matrix $\hat{R}_t^{Pro}(u_1, s_1, t_1; u_i, s_j, t_m)$ are complex numbers, and dimension of the matrix is U×S×M.

18. The device according to claim 17, wherein the processor executes the computer programs to perform further actions of:
  constructing the target optimization equation according to the joint space-time correlation of the target channel and the joint space-time correlation of the reconstructed channel as $$\min_G \left\| R_t(u_1, s_1, t_1'u_i, s_j, t_m) - \hat{R}_t^{PrO}(u_1, s_1, t_1; u_i, s_j, t_m; G) \right\|_2^2;$$

where, $R_t(u_1, s_1, t_1; u_i, s_j, t_m)$ denotes the joint space-time correlation of the target channel, $\hat{R}_t^{Pro}(u_1, s_1, t_1; u_i, s_j, t_m; G)$ denotes the joint space-time correlation of the reconstructed channel, and G is the weight matrix.

19. The device according to claim 15, wherein the processor executes the computer programs to perform further actions of:
  calculating, for each probe antenna of the probe antennas, a transition equation of rays in each cluster mapped to each probe antenna using $h_{k,s,n}^{Pro}(t, \tau) = \Sigma_{q=1}^Q \sqrt{\alpha_{k,q}} \cdot h_{k,s,n,q}^{Pro}(t, \tau)$;
  where, $\alpha_{k,q}$ denotes a weight of a q-th ray mapped to a k-th probe antenna of the probe antennas, $\mathbb{R}$ denotes a real number, $\alpha_{k,q} \in \mathbb{R}$ indicates $\alpha_{k,q}$ is a real number, Q denotes a total number of rays in a n-th cluster, $h_{k,s,n}^{Pro}(t, \tau)$ is a transition equation from a s-th transmitting antenna of a user terminal to the k-th probe antenna on the q-th ray of the n-th cluster;

$$h_{k,s,n,q}^{PrO}(t, \tau) = $$

$$\sqrt{\frac{P_n}{Q}} \cdot F_S^V(\Omega_{n,q}^{AoD}) \cdot F_k \cdot \exp\left(j\frac{2\pi}{\lambda}r_{n,q}^{tx} \cdot d_s^{tx}\right) \cdot \exp(j\pi v_{n,q}t + j\alpha_{n,q,k}) \cdot \delta(\tau - \tau_n)$$

where, t denotes time, τ denotes a time delay, $P_n$ denotes power of the n-th cluster, $F_s^V$ denotes a vertically polarized antenna pattern of the s-th transmitting antenna of the user terminal, $\Omega_{n,q}^{AoD}$ denotes an AoD of a q-th ray of the n-th cluster, $F_k$ denotes an ideal polarized antenna pattern of the k-th probe antenna, $\lambda$ denotes a wavelength, $r_{n,q}^{tx}$ denotes a spherical unit vector from transmitting antennas of the user terminal to $\Omega_{n,q}^{AoD}$, $d_s^{tx}$ denotes a position vector of the s-th transmitting antenna relative to a center of the user terminal, $v_{n,q}$ denotes a Doppler frequency of the q-th ray of the n-th cluster, $\alpha_{n,q,k}$ denotes a random phase of the q-th ray of the n-th cluster mapped to the k-th probe antenna, $\delta(\tau-\tau_n)$ denotes a pulse function, and $\tau_n$ denotes a delay of the n-th cluster.

20. The device according to claim 19, wherein the processor executes the computer programs to perform further actions of:

calculating the transition matrix from each probe antenna to the receiving antennas of the DUT using $$v = \left\{ F_u^V(\Omega_k) \cdot \exp\left( j \frac{2\pi}{\lambda} r_k^{rx} \cdot d_u^{rx} \right) \right\} \in \mathbb{C}^{1 \times K};$$

where, v denotes a transition matrix from K probe antennas to a u-th receiving antenna of the DUT, $\mathbb{C}^{1 \times K}$ denotes elements of v are complex numbers, and dimension of v is 1×K, $F_u^V$ denotes a vertically polarized antenna pattern of a u-th receiving antenna of the DUT, $\Omega_k$ denotes a spatial angle of the k-th probe antenna, $r_k^{rx}$ denotes a spherical unit vector of the k-th probe antenna, and $d_u^{rx}$ denotes a position vector of the u-th receiving antenna relative to a center of a base station.

* * * * *